(12) United States Patent
Aoki et al.

(10) Patent No.: US 7,084,633 B2
(45) Date of Patent: Aug. 1, 2006

(54) MAGNETIC FIELD GENERATING DEVICE AND MRI EQUIPMENT USING THE DEVICE

(75) Inventors: Masaaki Aoki, Takatsuki (JP); Tsuyoshi Tsuzaki, Osaka-fu (JP)

(73) Assignee: Neomax Co., Ltd., Osaka (JP)

( * ) Notice: Subject to any disclaimer, the term of this patent is extended or adjusted under 35 U.S.C. 154(b) by 0 days.

(21) Appl. No.: 10/513,793

(22) PCT Filed: May 19, 2003

(86) PCT No.: PCT/JP03/06238

§ 371 (c)(1), (2), (4) Date: Nov. 17, 2004

(87) PCT Pub. No.: WO03/096897

PCT Pub. Date: Nov. 27, 2003

(65) Prior Publication Data
US 2005/0151539 A1     Jul. 14, 2005

(30) Foreign Application Priority Data
May 20, 2002   (JP)   ............................. 2002-144418

(51) Int. Cl.
*G01V 3/00*   (2006.01)

(52) U.S. Cl. ...................................... 324/319; 335/296

(58) Field of Classification Search ................. 324/319, 324/320; 335/296, 302
See application file for complete search history.

(56) References Cited

U.S. PATENT DOCUMENTS

| 4,695,802 A | * | 9/1987 | Zijlstra ........................ 324/319 |
| 5,319,339 A | * | 6/1994 | Leupold ....................... 335/306 |
| 5,467,769 A | * | 11/1995 | Yoshino et al. ............. 600/410 |
| 5,621,324 A |   | 4/1997 | Ota et al. |
| 5,635,889 A | * | 6/1997 | Stelter ......................... 335/306 |

FOREIGN PATENT DOCUMENTS

| EP | 591542 A1 | 4/1994 |
| JP | 6-151160 | 5/1994 |
| JP | 62-51931 | 9/1994 |
| JP | 2001-70280 | 3/2001 |

* cited by examiner

*Primary Examiner*—Louis Arana
(74) *Attorney, Agent, or Firm*—Armstrong, Kratz, Quintos, Hanson & Brooks, LLP

(57) ABSTRACT

A magnetic field generator (10) capable of generating a more intense magnetic field, and an MRI apparatus (200) using it are provided. Permanent magnets (12a), (12b), (14a), (14b), (16a), (16b), (18a), (18b), (20a), (20b), (22) and (24) are disposed annularly for formation of a magnetic field generation space (30). Ferromagnetic materials (26a) and (26b) are provided near the magnetic field generation space (30), at places passed by a magnetic flux. Each of the permanent magnets (12a), (14a), (16a), (18a) and (20a) surrounding the ferromagnetic material (26a) is magnetized so as to make an S pole on the side of the ferromagnetic material (26a). Each of the permanent magnets (12b), (14b), (16b), (18b) and (20b) surrounding the ferromagnetic material (26b) is magnetized so as to make an N pole on the side of the ferromagnetic material (26b). An MRI apparatus (200) is obtained by using the magnetic field generator (10).

9 Claims, 18 Drawing Sheets

FIG. 1
10
(a)
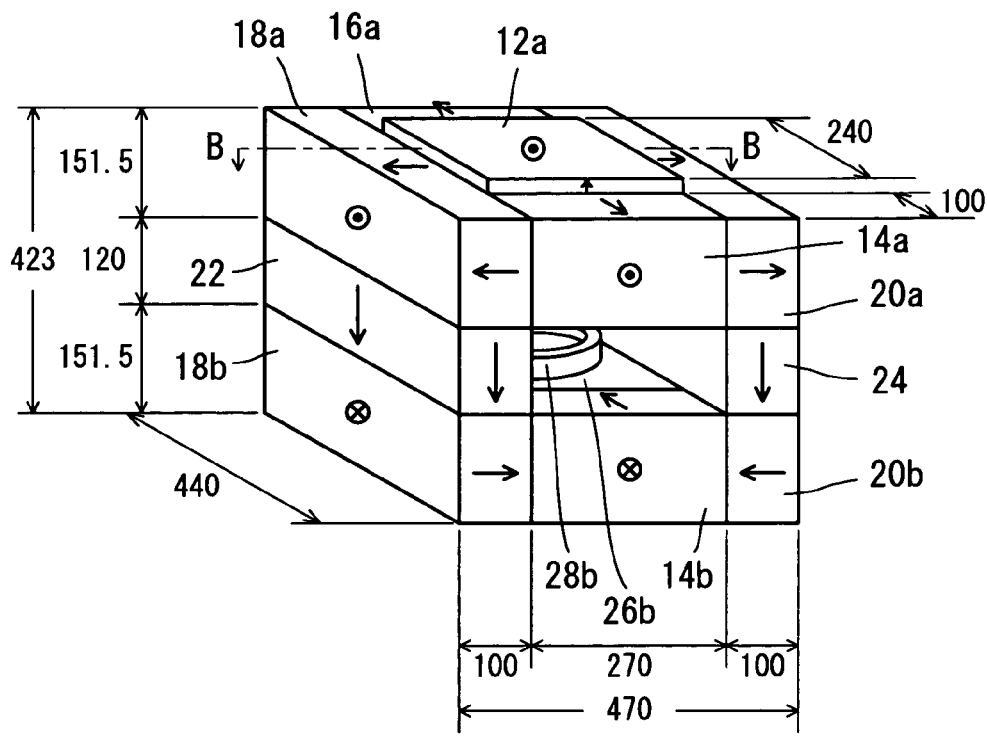
(b)    (c)
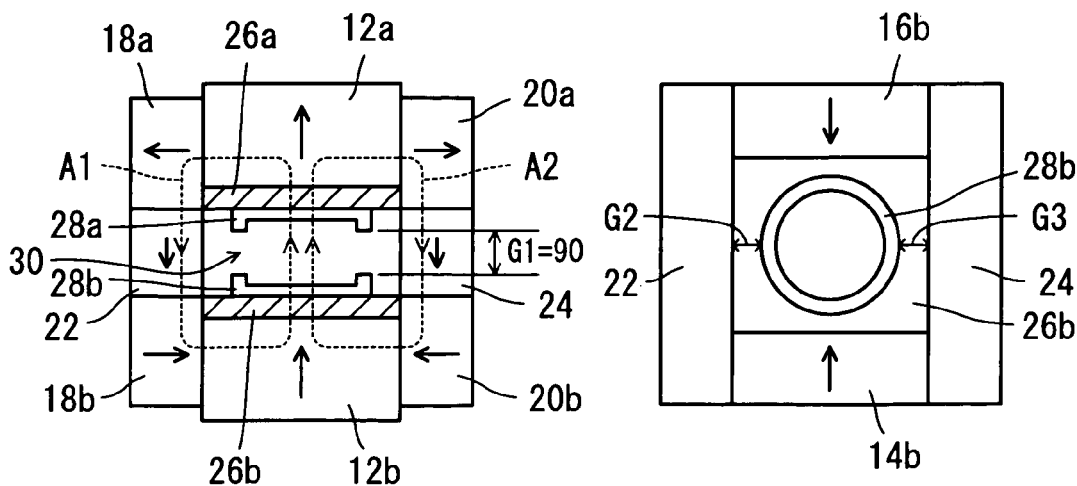

FIG. 4
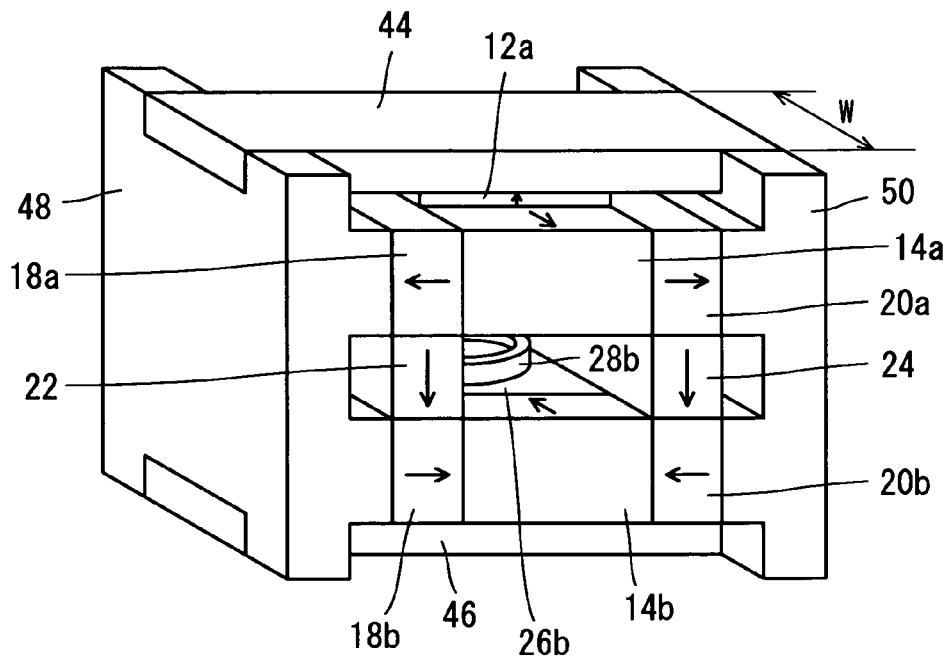
(a)
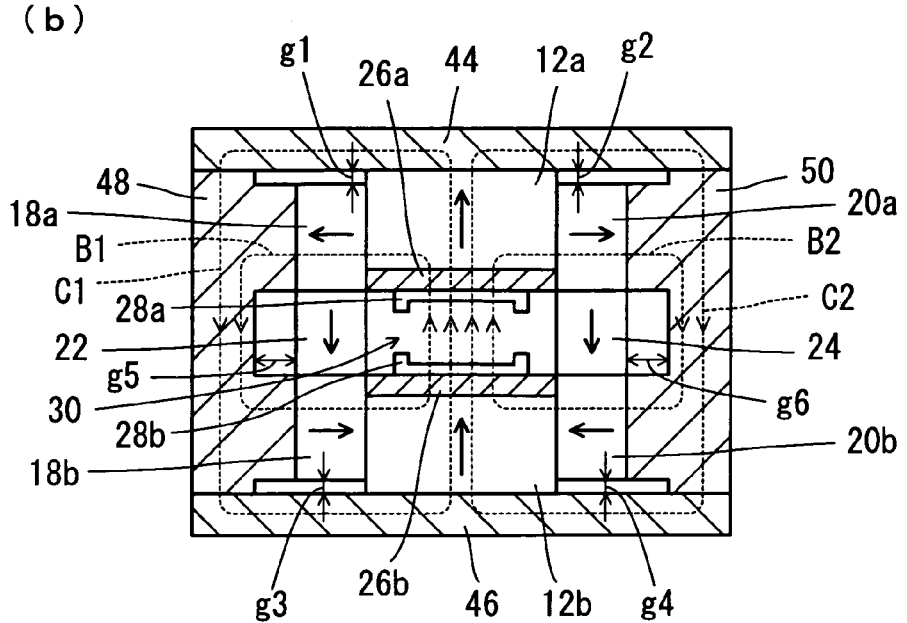
(b)

FIG. 5
10c
(a)
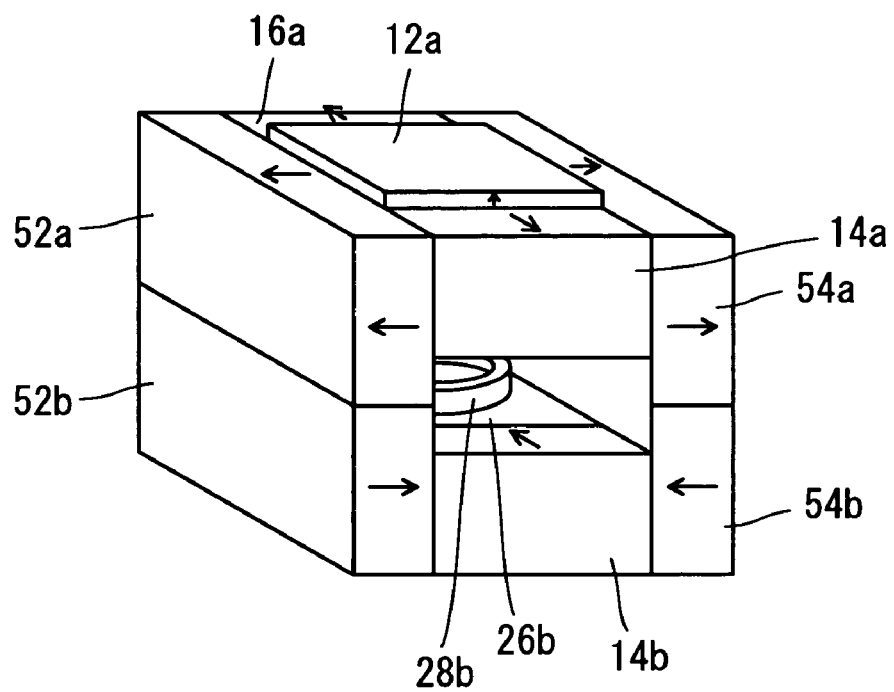
(b)
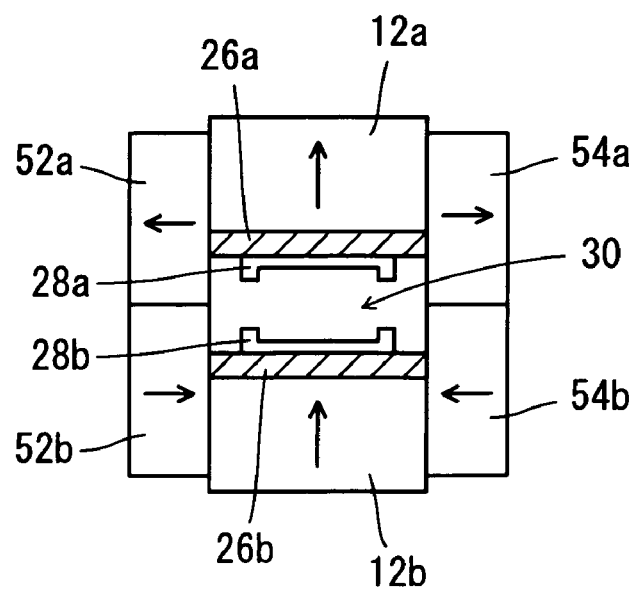

F I G. 6
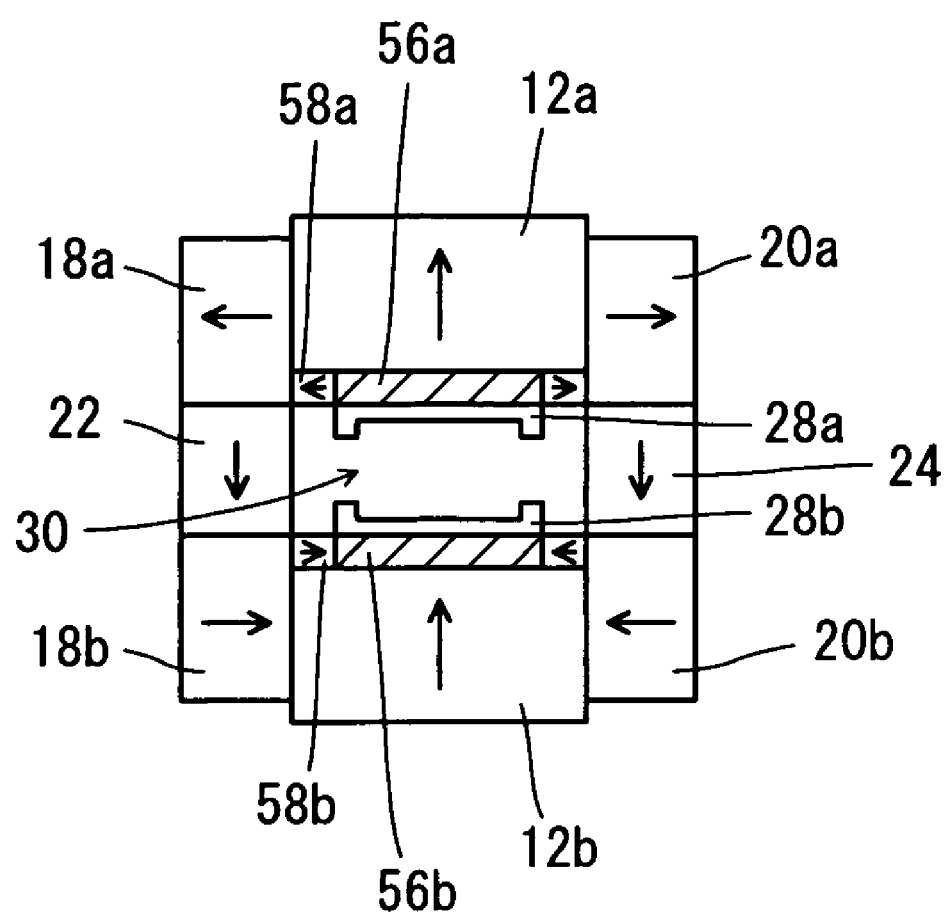

FIG. 10
10h
(a)
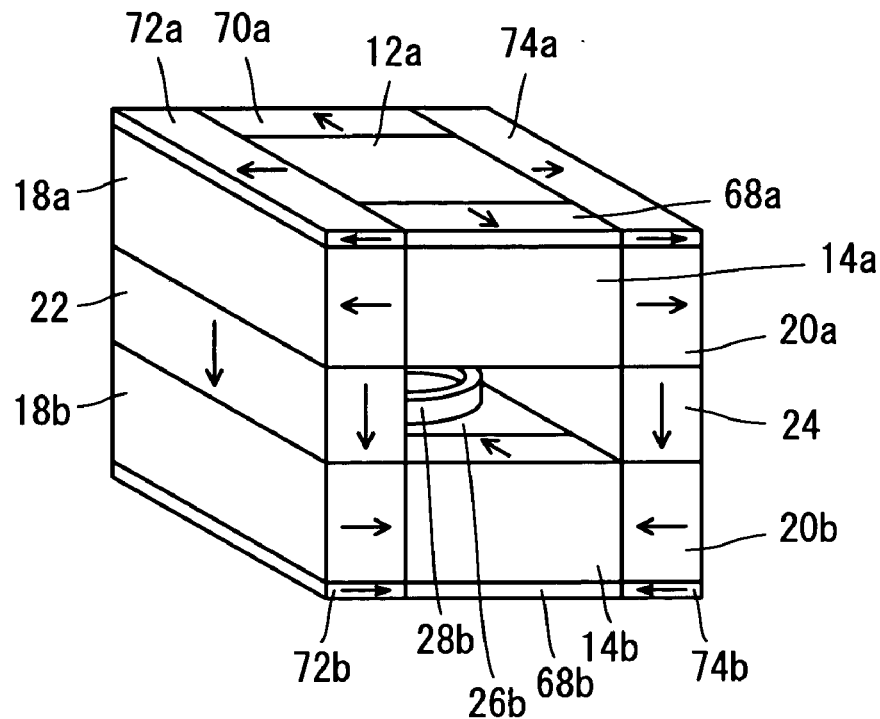
(b)
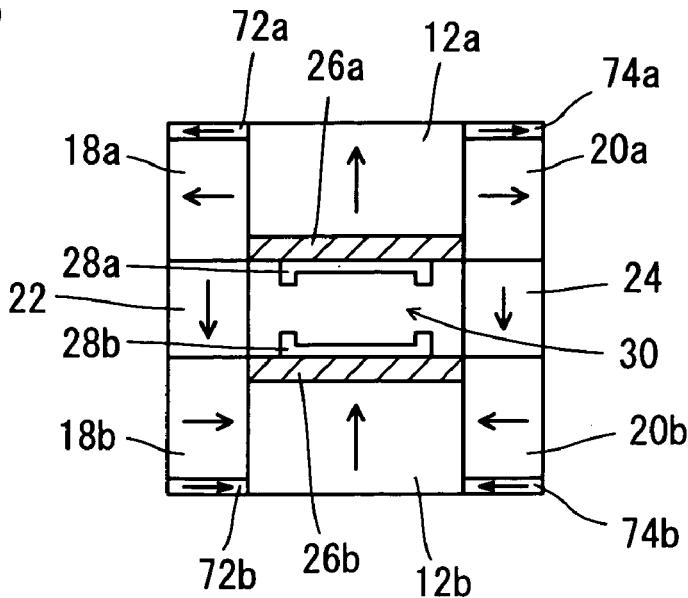

FIG. 11
10i
(a)
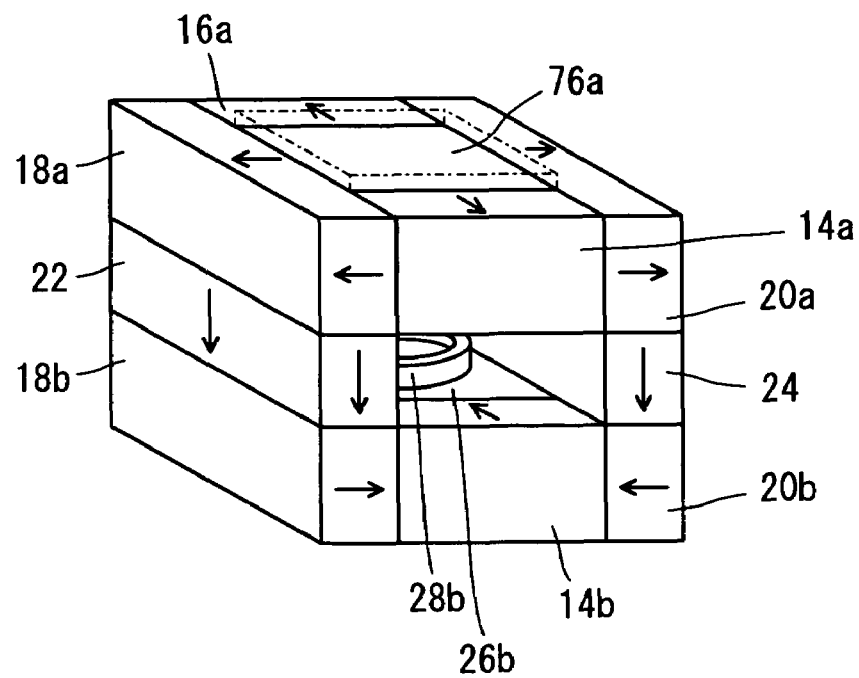
(b)
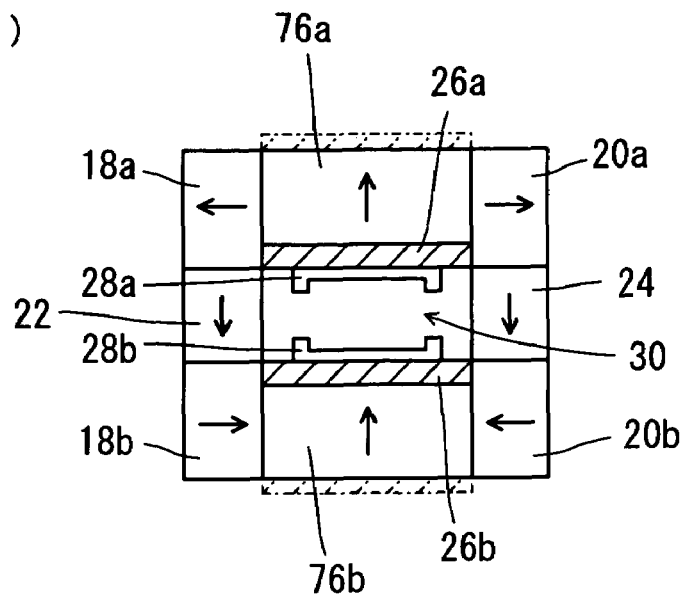

FIG. 12
(a)
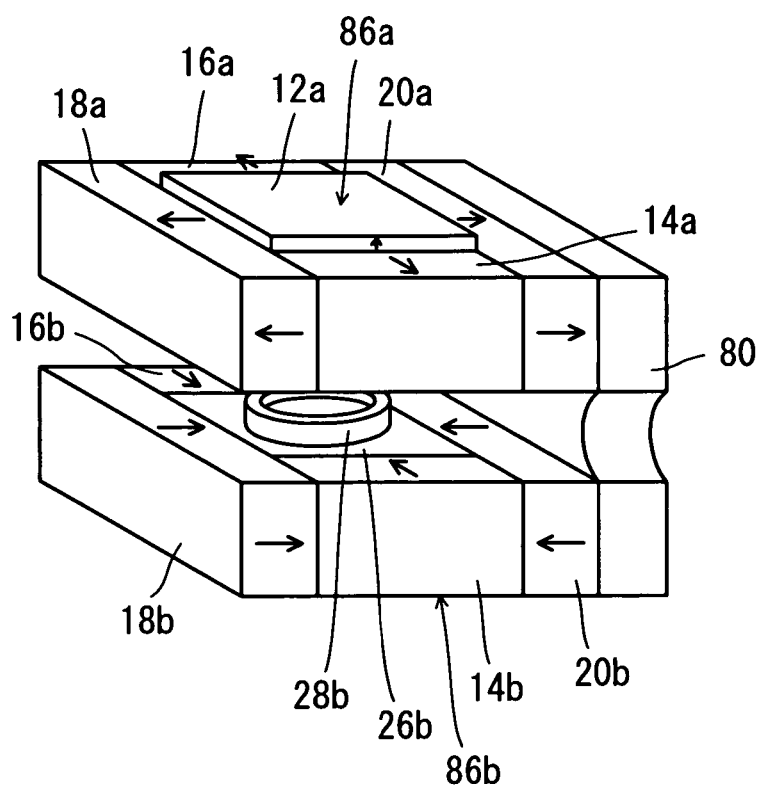
(b)
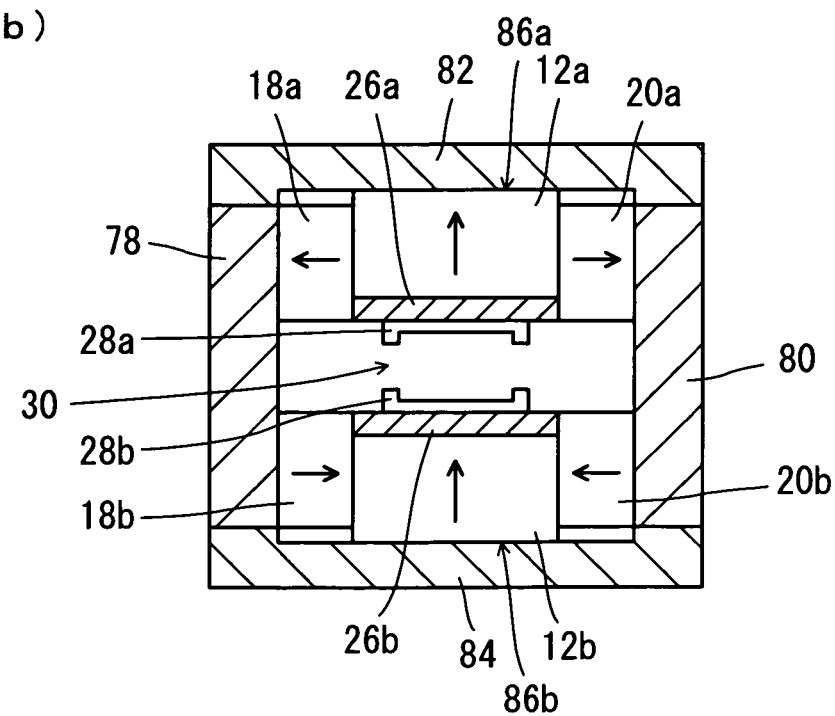

MAGNETIC FIELD GENERATING DEVICE AND MRI EQUIPMENT USING THE DEVICE

TECHNICAL FIELD

The present invention relates to a magnetic field generator and an MRI apparatus using it. More specifically, the present invention relates to a small, permanent-magnet-type magnetic field generator and an MRI apparatus utilizing it, for diagnosis of body parts such as a finger, small animals, inside of food.

BACKGROUND ART

The applicant of the present patent application has proposed a magnetic field generator of this kind in JP-A 2001-70280. The magnetic field generator includes a first magnetic circuit which is a closed circuit provided by magnets, and a second magnetic circuit provided by attaching magnets which are magnetized in a direction perpendicular to the direction of magnetic flux of the first magnetic circuit, to the magnets that provide the first magnetic circuit. The magnetic field generator is characterized by that the two magnetic fluxes, one generated by the first magnetic circuit and the other generated by the second magnetic circuit, overlap each other.

In this magnetic field generator, due to a fact that relative permeability of permanent magnets is close to 1, it is sometimes impossible to sufficiently introduce the magnetic flux generated by the second magnetic circuit into the magnetic field generation space, leading to decreased efficiency of the magnetic circuit and reduced intensity of the magnetic field generated in the magnetic field generation space.

It is therefore a primary object of the present invention to provide a magnetic field generator and an MRI apparatus using the generator, capable of generating a greater magnetic field intensity.

DISCLOSURE OF THE INVENTION

According to an aspect of the present invention, there is provided a magnetic field generator which includes: a plurality of magnets disposed annularly for formation of a magnetic field generation space; and a ferromagnetic material provided near the magnetic field generation space, at a place passed by a magnetic flux.

According to the present invention, the ferromagnetic material which has a large relative permeability is provided near the magnetic field generation space at a place passed by a magnetic flux, whereby it becomes possible to introduce magnetic fluxes sufficiently into the magnetic field generation space, and to improve efficiency of the magnetic circuit. Therefore, it is possible to increase magnetic field intensity generated in the magnetic field generation space.

According to another aspect of the present invention, there is provided a magnetic field generator which includes: a plurality of magnets disposed annularly for formation of a magnetic field generation space; and a ferromagnetic material provided near the magnetic field generation space. The magnets around the ferromagnetic material have their sides which are on the ferromagnetic material being the same pole.

According to the present invention, the ferromagnetic material which is placed near the magnetic field generation space is surrounded by the magnets which have the same pole on the side of the ferromagnetic material. Therefore, the ferromagnetic material serves as a powerful pole piece. Specifically, when the magnets are disposed to make an N pole on the side of the ferromagnetic material, the ferromagnetic material works as a powerful N-pole pole piece. On the other hand, when the magnets are disposed to make an S pole on the side of the ferromagnetic material, the ferromagnetic material works as a powerful S-pole pole piece. Therefore, it becomes possible to introduce magnetic fluxes sufficiently into the magnetic field generation space, and to improve magnetic field intensity in the magnetic field generation space.

Preferably, a ratio of 1:7.5 through 9:10 is satisfied between a thickness of the ferromagnetic material and a thickness of the magnet outside the ferromagnetic material. In this case, it becomes possible to introduce magnetic fluxes sufficiently to the magnetic field generation space and to reduce magnetic leakage flux from the magnets. Thus, a higher magnetic field intensity is obtained.

Here, the term "outside the ferromagnetic material" refers to a side of the ferromagnetic material facing away from the magnetic field generation space.

Preferably, the ferromagnetic material is provided with an annular projection on a side of the magnetic field generation space, and the annular projection has a side surface spaced from the magnets by a distance not smaller than 3 mm. In this case, it is possible to prevent magnetic flux short-circuiting in an annular-type magnetic field generator.

Further, preferably, the ferromagnetic material is provided with an annular projection on a side of the magnetic field generation space, and the magnets disposed annularly include a plurality of magnets contacting the ferromagnetic material. The magnets contacting the ferromagnetic material are magnetized in different directions from each other, and include a magnet magnetized in a direction generally the same as of a magnetic flux in the magnetic field generation space. As in the above, by having the ferromagnetic material making contact with the magnet which is magnetized in generally the same direction as of the flux in the magnetic field generation space as well as making contact with the other magnets which are magnetized in different directions from each other, it becomes possible to improve magnetic field intensity in the magnetic field generation space.

Preferably, the ferromagnetic material has a thickness not smaller than 5 mm when a gap formed in the magnetic field generation space is not smaller than 25 mm. In this case, it becomes possible to further reduce magnetic flux saturation, and to improve efficiency as a magnetic circuit.

Further, preferably, each of the magnets is parallelepiped. In this case, it becomes easy to manufacture or obtain necessary magnets, as well as to assemble the magnetic field generator.

Further, preferably, the magnets disposed at corners on the same plane as on the ferromagnetic material are magnetized in an outward or inward direction as viewed from the ferromagnetic material. In this case, it becomes possible to reduce magnetic fluxes which do not pass through the magnetic field generation space in the magnetic field generator, and to make more magnetic fluxes flow into the magnetic field generation space. Therefore, efficiency as a magnetic circuit improves, enabling to improve magnetic field intensity.

Preferably, the magnetic field generator further includes a connecting member which provides magnetic connection between the magnets disposed around the ferromagnetic material. In this case, more magnetic circuits can be formed within the magnetic field generator, which makes possible to reduce magnetic flux leakage, to introduce magnetic fluxes more efficiently into the magnetic field generation space, and as a result, to improve magnetic field intensity.

In general, magnetic fluxes are prone to saturation if the magnetic field intensity of the magnetic field generation space in the magnetic field generator is not smaller than 1.0 T. However, according to the present invention, by providing a ferromagnetic material which has a large relative permeability near the magnetic field generation space, it is possible to reduce magnetic flux saturation even when the magnetic field intensity of the magnetic field generation space is not smaller than 1.0 T.

According to another aspect of the present invention, there is provided a magnetic field generator which includes: a pair of pole piece units opposed to each other for formation of a magnetic field generation space; and a connecting member magnetically connecting the pole piece units. Each pole piece unit includes a plurality of magnets, and a ferromagnetic material provided near the magnetic field generation space, at a place passed by a magnetic flux.

According to the present invention, ferromagnetic materials which have a large relative permeability are provided near the magnetic field generation space, at places passed by magnetic fluxes, whereby it becomes possible to introduce magnetic fluxes sufficiently into the magnetic field generation space, and to improve efficiency of the magnetic circuit. Therefore it is possible to improve magnetic field intensity in the magnetic field generation space.

Further, according to another aspect of the present invention, there is provided a magnetic field generator which includes: a pair of pole piece units opposed to each other for formation of a magnetic field generation space; and a connecting member magnetically connecting the pole piece units. Each pole piece unit includes a plurality of magnets and a ferromagnetic material provided near the magnetic field generation space. The magnets around the ferromagnetic material have their sides on the ferromagnetic material being the same pole.

According to the present invention, each of the ferromagnetic materials placed near the magnetic field generation space is surrounded by the magnets which have the same pole on the side of the ferromagnetic material. Therefore, the ferromagnetic materials serve as powerful pole pieces. Thus, it becomes possible to introduce magnetic fluxes sufficiently into the magnetic field generation space, and to improve magnetic field intensity in the magnetic field generation space.

Further, by using one of the magnetic field generators described above, it is possible to manufacture an MRI apparatus which is capable of obtaining a clearer image.

BRIEF DESCRIPTION OF THE DRAWINGS

FIG. 1(a) is a perspective view of an embodiment of the present invention; FIG. 1(b) is a conceptual diagram of the embodiment; FIG. 1(c) is a conceptual diagram without an upper part;

FIG. 4(a) is a perspective view of another embodiment of the present invention; FIG. 4(b) is a conceptual diagram of the embodiment;

FIG. 5(a) is a perspective view of still another embodiment of the present invention; FIG. 5(b) is a conceptual diagram of the embodiment;

FIG. 6 is a conceptual diagram of another embodiment of the present invention;

FIG. 10(a) is a perspective view of another embodiment of the present invention; FIG. 10(b) is a conceptual diagram of the embodiment;

FIG. 11(a) is a perspective view of still another embodiment of the present invention; FIG. 11(b) is a conceptual diagram of the embodiment;

FIG. 12(a) is a partially unillustrated perspective view of another embodiment of the present invention; FIG. 12(b) is a conceptual diagram of the embodiment;

BEST MODE FOR CARRYING OUT THE INVENTION

Figure 2:
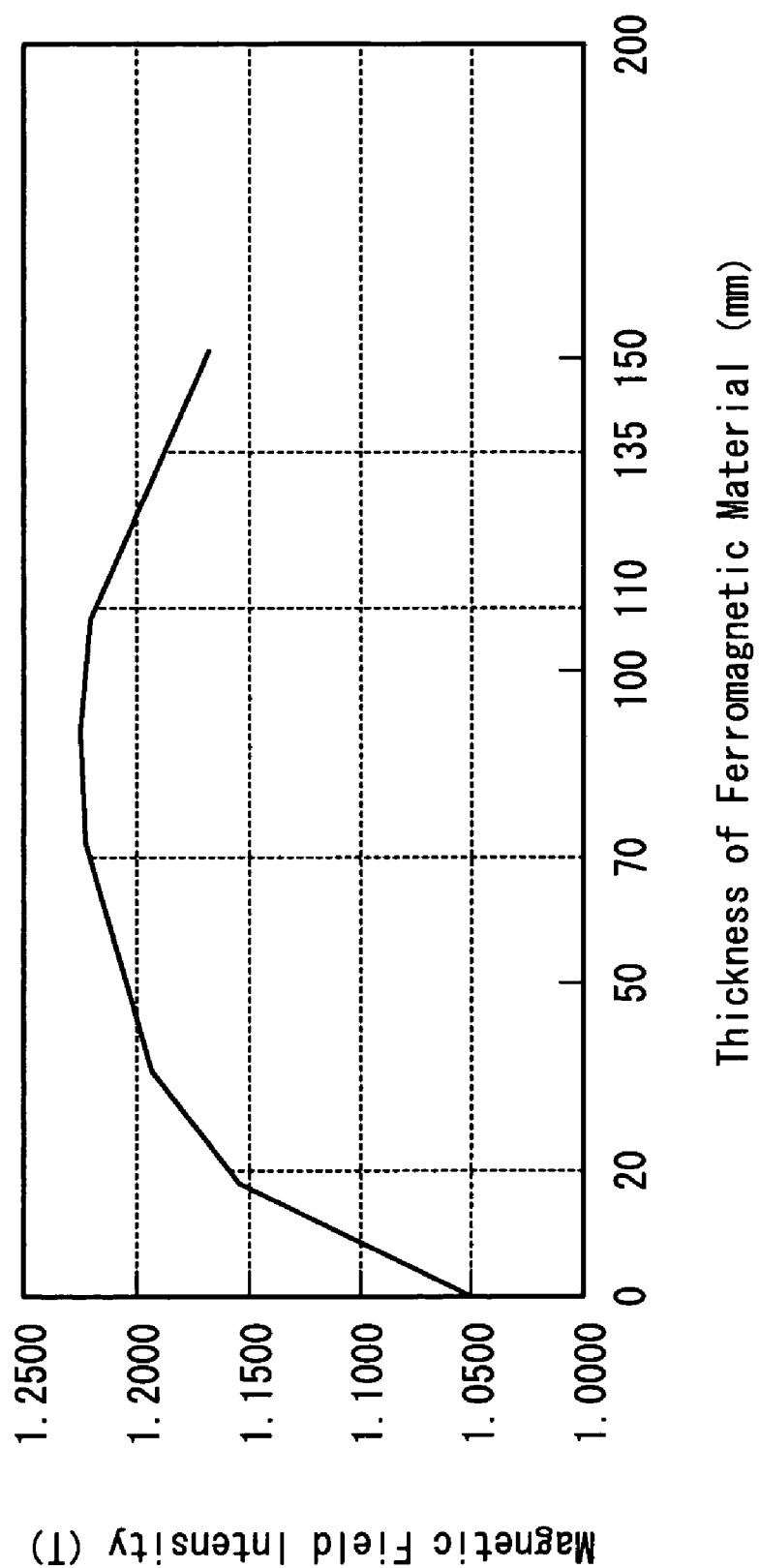
FIG. 2 is a graph showing a result of an experiment conducted with the embodiment in FIG. 1.

Hereinafter, embodiments of the present invention will be described with reference to the drawings.

Referring to FIG. 1(a) through FIG. 1(c), a magnetic field generator 10 as an embodiment of the present invention is formed generally into a parallelepiped using a plurality of parallelepiped permanent magnets, and has outer dimensions of 470 mm×440 mm×423 mm for example. Note that FIG. 1(b) is a conceptual diagram illustrating a section (a longitudinal section passing an upper surface of a permanent magnet 12a) taken in lines B—B in FIG. 1(a).

The magnetic field generator 10 includes a pair of parallelepiped permanent magnets 12a and 12b.

Parallelepiped permanent magnets 14a, 16a, 18a and 20a are provided around (on side faces of) the permanent magnet 12a respectively. The permanent magnet 12a makes contact and is magnetically connected with permanent magnets 14a, 16a, 18a and 20a. Under this state, the permanent magnets 14a and 16a are opposed to each other, sandwiching the permanent magnet 12a. Further, the permanent magnets 18a and 20a are opposed to each other, sandwiching the permanent magnets 12a, 14a and 16a.

Likewise, parallelepiped permanent magnets 14b, 16b, 18b and 20b are provided around (on side faces of) the permanent magnet 12b respectively. The permanent magnet 12b makes contact and is magnetically connected with permanent magnets 14b, 16b, 18b and 20b. Under this state, the permanent magnets 14b and 16b are opposed to each other, sandwiching the permanent magnet 12b. Further, the permanent magnets 18b and 20b are opposed to each other, sandwiching the permanent magnets 12b, 14b and 16b. As shown in FIG. 1(c), the permanent magnet 16b is placed to make a pair with the permanent magnet 14b, on a rear side surface of the permanent magnet 12b as well as below the permanent magnet 16a, as shown FIG. 1(a) and FIG. 1(b).

Further, the permanent magnets 18a and 18b sandwich a permanent magnet 22, whereas the permanent magnets 20a and 20b sandwich a permanent magnet 24. This arrangement creates a gap between the permanent magnets 12a and 12b.

As in the above description, the permanent magnets are disposed annularly, to form magnetic circuits A1 and A2 as shown in FIG. 1(b). As an annular magnetic field generator, the generator may not only be a box type as the magnetic field generator 10 but also have the magnets disposed in a ring shape as in a Halbach magnetic field generator.

The permanent magnets 12a and 12b have the same dimensions, e.g. 270 mm×240 mm×151.5 mm. The permanent magnets 14a, 14b, 16a and 16b have the same dimensions, e.g. 270 mm×100 mm×151.5 mm. The permanent magnets 18a, 18b, 20a and 20b have the same dimensions, e.g. 100 mm×440 mm×151.5 mm. The permanent magnets 22 and 24 have the same dimensions, e.g. 100 mm×440 mm×120 mm.

Further, ferromagnetic materials 26a and 26b are disposed respectively on a lower surface of the permanent magnet 12a and on an upper surface of the permanent magnet 12b.

In this embodiment, the term "ferromagnetic material" refers to a member which has a saturation magnetization not smaller than 1.0 T.

The ferromagnetic materials 26a and 26b are provided by high permeability iron, JIS:S15C, permendule (iron-cobalt alloy) and so on. In this embodiment, the ferromagnetic materials 26a and 26b have the same width as the permanent magnets 12a and 12b, e.g. 270 mm in width, and 240 mm in depth.

Further, the ferromagnetic material 26a has its lower surface flush with the lower surfaces of the permanent magnets 14a, 16a, 18a and 20a. Therefore, the ferromagnetic material 26a is disposed as buried in the permanent magnets, near a magnetic field generation space 30 (to be described later), at a place passed by a magnetic flux. Likewise, the ferromagnetic material 26b has its upper surface flush with the upper surfaces of the permanent magnets 14b, 16b, 18b and 20b. Therefore, the ferromagnetic material 26b is disposed as buried in the permanent magnets, near the magnetic field generation space 30 (to be described later), at a place passed by a magnetic flux. As a result, the ferromagnetic material 26a is magnetically connected (surface contact) with a plurality of the permanent magnets 12a, 14a, 16a, 18a and 20a each magnetized in a different direction from others. The same applies to the ferromagnetic material 26b. It should be noted here that angles made by the direction of magnetic flux in the magnetic field generation space 30 and the direction of magnetization of the permanent magnets 12a, 12b are smaller than 5 degrees and generally in the same direction. With this arrangement, it becomes possible to improve magnetic field intensity of the magnetic field generation space 30.

Further, the ferromagnetic material 26a has its lower surface provided with a pole piece 28a, and the ferromagnetic material 26b has its upper surface provided with a pole piece 28b. Therefore, the ferromagnetic material 26a is sandwiched between the permanent magnet 12a and the pole piece 28a, whereas the ferromagnetic material 26b is sandwiched between the permanent magnet 12b and the pole piece 28b. The magnetic field generation space 30 is formed between the pole pieces 28a and 28b. In this embodiment, the pole pieces 28a and 28b are spaced by a gap G1 which is 90 mm, in the magnetic field generation space 30.

FIG. 1(c) is a conceptual diagram showing the magnetic field generator 10 without its upper portion, illustrating the ferromagnetic material 26b and the pole piece 28b disposed thereon, including an annular projection. The pole piece 28b (annular projection) and the permanent magnets 22, 24 are spaced by gaps G2, G3, each not smaller than 3 mm and preferably not smaller than 5 mm, for preventing magnetic short-circuiting and uniformity deterioration. Further, as shown in FIG. 1(c), an area surrounded by the outer circumference of the pole piece 28b (annular projection) is smaller than the area of upper surface of the ferromagnetic material 26b, so that magnetic fluxes can be gathered more efficiently by the ferromagnetic material 26b.

In the figure, arrows drawn in solid lines in the permanent magnets show the direction of magnetization of the magnet. In FIG. 1(a), a symbol × (a cross) in ○ (a circle) indicates that the magnet is magnetized in a direction penetrating into the marked surface perpendicularly, whereas a symbol • (a dot) in ○ (a circle) indicates that the magnet is magnetized in a direction projecting out of the marked surface perpendicularly.

Further, as shown in FIG. 1, each of the permanent magnets 12a, 14a, 16a, 18a and 20a surrounding the ferromagnetic material 26a is magnetized in an outward direction as viewed from the ferromagnetic material 26a, i.e. so that the side on the ferromagnetic material 26a serves as an S pole. Thus, the ferromagnetic material 26a serves as a powerful South-pole pole piece. On the other hand, each of the permanent magnets 12b, 14b, 16b, 18b and 20b surrounding the ferromagnetic material 26b is magnetized toward the ferromagnetic material 26b, i.e. so that the side on the ferromagnetic material 26b serves as an N pole. Thus, the ferromagnetic material 26b serves as a powerful North-pole pole piece.

According to the magnetic field generator 10, the ferromagnetic materials 26a and 26b which have a large saturation flux density are provided near the magnetic field generation space 30, at places passed by magnetic fluxes. With this arrangement, it is possible to introduce magnetic fluxes from the magnets around the ferromagnetic materials 26a, 26b efficiently to the magnetic field generation space 30 even if the magnetic field generation space 30 has a magnetic field intensity not smaller than 1.0 T. Also, as has been described, the ferromagnetic materials 26a and 26b serve as powerful pole pieces.

Therefore, by introducing magnetic fluxes sufficiently into the magnetic field generation space 30, it becomes possible to improve magnetic circuit efficiently and increase magnetic field intensity generated in the magnetic field generation space 30. In particular, it is possible to achieve a magnetic field intensity higher than in magnetic field generators which use the same weight in permanent magnets.

Further, the magnetic field generator 10 uses parallelepiped permanent magnets. This makes easy to manufacture or obtain necessary magnets, as well as to assemble the magnetic field generator 10.

A result of an experiment conducted with the magnetic field generator 10 described above is shown in FIG. 2.

In this experiment example, the thickness of permanent magnets 12a and 12b, and the gap G1 between the pole piece 28a and 28b were kept constant while the thickness of the ferromagnetic materials 26a and 26b were varied, and measurements were made for the magnetic field intensity generated in the magnetic field generation space 30. The ferromagnetic materials 26a and 26b were provided by high permeability iron.

From the result of experiment shown in FIG. 2, it is understood that use of ferromagnetic materials 26a and 26b in the magnetic field generator 10 creates magnetic field intensity not smaller than 1.05 T (tesla) in the magnetic field generation space 30, making possible to improve the magnetic field intensity than before.

In particular, a better effect is achieved if the thickness of the ferromagnetic materials 26a and 26b is not smaller than 20 mm and not greater than 135 mm approx., i.e. when the thickness of ferromagnetic materials 26a, 26b and the thickness of permanent magnets 12a, 12b (permanent magnets provided outside the ferromagnetic materials 26a, 26b) make a ratio 1:7.5 through 9:10. By providing ferromagnetic materials 26a and 26b which satisfy the above thickness condition, it becomes possible to improve magnetic field intensity while sufficiently reducing magnetic flux saturation and not very much increasing magnetic leakage flux from e.g. side surfaces of the permanent magnets 12a and 12b projecting out of the upper and the lower surfaces respectively of the magnetic field generator 10.

More preferably, the ferromagnetic materials 26a and 26b have a thickness not smaller than 70 mm and not greater than 110 mm approx. In this case, the ratio between the thickness of ferromagnetic materials 26a, 26b and the thickness of permanent magnets 12a, 12b becomes 1:2 through 7:10 approx., making possible to further improve magnetic field intensity in the magnetic field generation space 30. For example, when the ferromagnetic materials 26a and 26b have a thickness of 90 mm, a magnetic field intensity of 1.226 T is obtained in the magnetic field generation space 30, which marks approximately 20% improvement over the magnetic field intensity achievable without the ferromagnetic materials 26a and 26b (1.05 T recorded in the experiment).

If the gap G1 in the magnetic field generation space 30 is not smaller than 25 mm, the ferromagnetic materials 26a and 26b should be given a thickness not smaller than 5 mm. This arrangement makes possible to introduce magnetic fluxes from the magnets around the ferromagnetic materials 26a, 26b efficiently into the magnetic field generation space 30, and to improve efficiency as a magnetic circuit.

Figure 3:
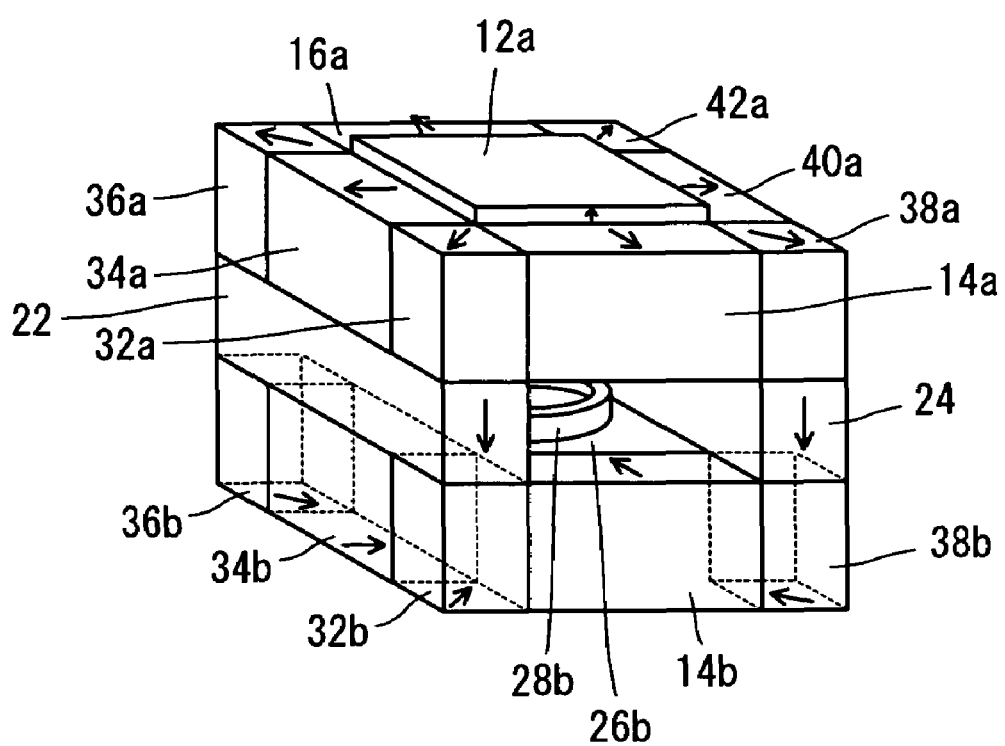
FIG. 3 is a perspective view of another embodiment of the present invention.

Next, FIG. 3 shows a magnetic field generator 10a as another embodiment of the present invention.

The magnetic field generator 10a makes use of three permanent magnets 32a, 34a and 36a in place of the permanent magnet 18a of the magnetic field generator 10 shown in FIG. 1. Likewise, the magnetic field generator 10a makes use of permanent magnets 38a, 40a and 42a in place of the permanent magnet 20a of the magnetic field generator 10 shown in FIG. 1, permanent magnets 32b, 34b and 36b in place of the permanent magnet 18b, and permanent magnets 38b, 40b and 42b in place of the permanent magnet 20b. It should be noted here that the permanent magnets 40b and 42b, which are not illustrated in FIG. 3, have the same dimensions as the permanent magnets 40a and 42a respectively, and are opposed to the permanent magnets 40a and 42a respectively, sandwiching the permanent magnet 24.

The permanent magnets 32a, 36a, 38a and 42a which are at corners have a square, horizontal cross section for example, and are magnetized in directions from the ferromagnetic material 26a toward respective corners, i.e. outwardly at a 45 degree angle with respect to side surfaces of the magnetic field generator 10. The permanent magnet 34a sandwiched by the permanent magnets 32a and 36a, and the permanent magnet 40a sandwiched by the permanent magnets 38a and 42a are parallelepiped, and magnetized in the same direction as the permanent magnets 18a and 20a of the magnetic field generator 10.

Further, the permanent magnets 32b, 36b, 38b and 42b which are at corners have a square, horizontal cross section for example, and are magnetized in directions from respective corners toward the ferromagnetic material 26b, i.e. inwardly at a 45 degree angle with respect to side surfaces of the magnetic field generator 10. The permanent magnet 34b sandwiched by the permanent magnets 32b and 36b, and the permanent magnet 40b sandwiched by the permanent magnets 38b and 42b are parallelepiped, and magnetized in the same direction as the permanent magnets 18b and 20b of the magnetic field generator 10.

The other arrangements in the magnetic field generator 10a are identical with the magnetic field generator 10 in FIG. 1, so the description will not be repeated here.

In the magnetic field generator 10a, the permanent magnets 32a, 36a, 38a, 42a and so on are used as permanent magnets which surround the ferromagnetic material 26a, whereas the permanent magnets 32b, 36b, 38b, 42b and so on are used as permanent magnets which surround the ferromagnetic material 26b. With this arrangement, the ferromagnetic materials 26a and 26b serve as more powerful pole pieces of S pole and N pole respectively, making possible to make more magnetic fluxes flow into the magnetic field generation space 30. Therefore, it becomes possible to improve efficiency as a magnetic circuit and to increase magnetic field intensity. For example, when the ferromagnetic materials 26a, 26b have a thickness of 90 mm, a magnetic field intensity of 1.271 T is obtained in the magnetic field generation space 30.

FIG. 4(a) and FIG. 4(b) show a magnetic field generator 10b as another embodiment of the present invention.

The magnetic field generator 10b is a magnetic field generator 10 in FIG. 1, which further includes yokes 44, 46, 48 and 50 each made of iron for example, as connecting members.

The yokes 44 and 46 are long members and disposed on an upper surface of a permanent magnet 12a and on a lower surface of a permanent magnet 12b respectively. Each of the yokes 48 and 50 generally has a shape like a letter π. The yoke 48 is connected with permanent magnets 18a and 18b, whereas the yoke 50 is connected with permanent magnets 20a and 20b. Further, the yoke 44 has its two ends connected with an upper end of the yoke 48 and an upper end of the yoke 50 respectively. The yoke 46 has its two ends connected with a lower end of the yoke 48 and a lower end of the yoke 50 respectively.

In this arrangement, protruding surfaces in the magnetic field generator 10, i.e. the upper surface of the permanent magnet 12a, the lower surface of the permanent magnet 12b, as well as side surfaces of the permanent magnets 18a, 18b, 20a and 20b can be magnetically connected with the yokes 44–50. This allows, as shown in FIG. 4(b), to form more magnetic circuits B1, B2, C1 and C2 in the magnetic field generator 10b. Therefore, it becomes possible to reduce magnetic flux leakage and introduce magnetic fluxes more efficiently into the magnetic field generation space 30, and as a result, to improve magnetic field intensity. For example, when the ferromagnetic materials 26a and 26b have a thickness of 90 mm, a magnetic field intensity of 1.364 T is obtained in the magnetic field generation space 30.

It should be noted here that if the yokes 44, 46 have a width W greater than the depth of permanent magnets 12a, 12b, magnetic fluxes from magnets other than the permanent magnets 12a, 12b can short-circuit. For this reason, the yokes 44, 46 should have their width W not too wide, or should have their width same as the depth of the permanent magnets 12a, 12b for example. Also, gaps g1, g2 between the yoke 44 and the permanent magnets 18a, 20a, gaps g3, g4 between the yoke 46 and the permanent magnets 18b, 20b, a gap g5 between the yoke 48 and the permanent magnet 22, and a gap g6 between the yoke 50 and the permanent magnet 24 should preferably be not smaller than 5 mm. These gaps may be filled with nonmagnetic members (e.g. SUS 304). Further, if a yoke which provides magnetic connection between the permanent magnets 14a and 14b is used, a more intense magnetic field will be formed.

Next, FIG. 5(a) and FIG. 5(b) show a magnetic field generator 10c as another embodiment of the present invention.

In the magnetic field generator 10c, permanent magnets 52a and 52b are used in place of the permanent magnets 18a, 18b and 22 of the magnetic field generator 10 shown in FIG. 1. Likewise, the permanent magnets 20a, 20b and 24 are replaced by permanent magnets 54a and 54b. Other arrangements are identical with the magnetic field generator 10, and so the description will not be repeated here.

In the magnetic field generator 10c, the permanent magnets 52a, 52b, 54a and 54b are magnetized in lateral directions, i.e. in directions perpendicular to the direction of magnetic field generated in the magnetic field generation space 30 (or an upward direction in the present embodiment), and is not exactly opposite to the direction of magnetic field generated in the magnetic field generation space 30. Therefore, permanent magnets 52a, 52b, 54a and 54b are less prone to demagnetization by the magnetic field generated in the magnetic field generation space 30. The present embodiment has a lower efficiency as a magnetic circuit than the embodiment shown in FIG. 1, yet is advantageous when magnetic field intensity in the magnetic field generation space 30 is very high.

FIG. 6 shows a magnetic field generator 10d as another embodiment of the present invention.

In the magnetic field generator 10d, the ferromagnetic materials 26a and 26b used in the magnetic field generator 10 shown in FIG. 1 are replaced by smaller ferromagnetic materials 56a and 56b. Further, the use of the ferromagnetic materials 56a and 56b provides gaps which are filled by annular permanent magnets 58a and 58b respectively. Preferably, the permanent magnet 58a is magnetized in an outward direction, whereas the permanent magnet 58b is magnetized in an inward direction. Such an arrangement makes possible to gather magnetic fluxes efficiently to a pole piece 28a and increase the amount of magnetic fluxes which pass a magnetic field generation space 30, since the ferromagnetic material 56a and the pole piece 28a are a similar in size. The permanent magnets 58a, 58b are magnetized in directions other than straight up or down, and may be slanted. Also, the permanent magnets 58a, 58b may have the same height as the annular projections. Other aspects in the construction of the magnetic field generator 10d are identical with those of the magnetic field generator 10 in FIG. 1, and so the description will not be repeated here again.

It should be noted that as shown in FIG. 6, the ferromagnetic materials 56a, 56b preferably have the same width as the pole pieces 28a, 28b or larger than the width of the pole pieces 28a, 28b, yet the width may be smaller than the width of the pole pieces 28a, 28b.

Figure 7:
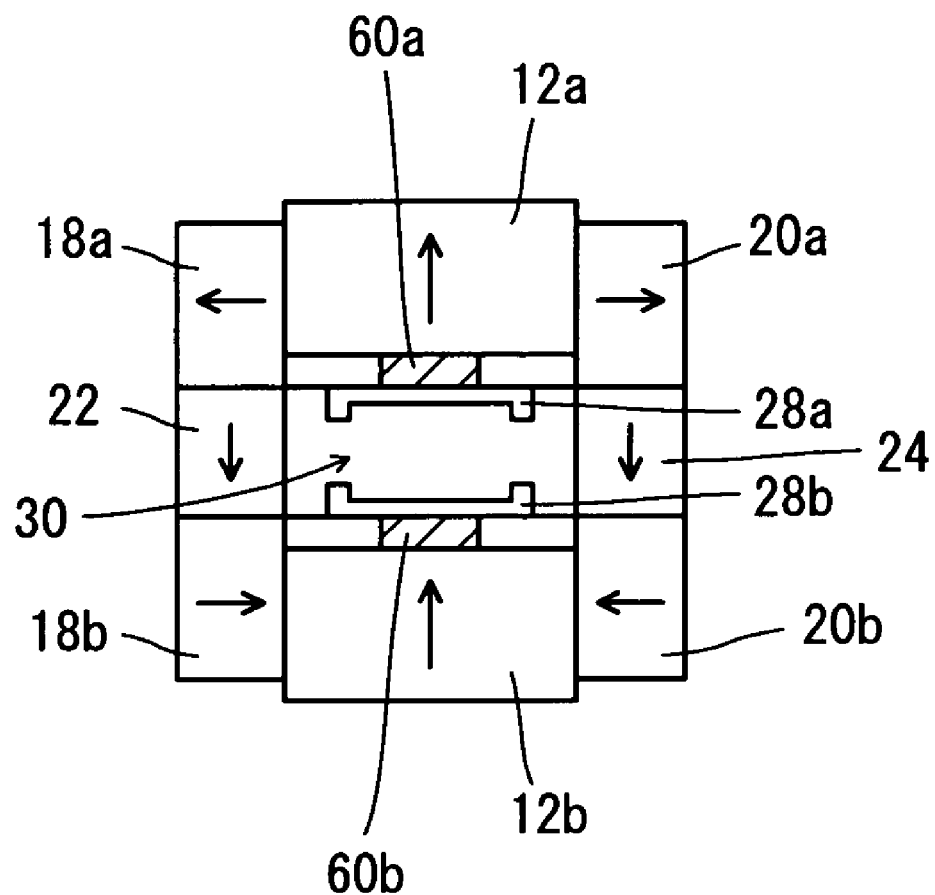
FIG. 7 is a conceptual diagram of another embodiment of the present invention.

FIG. 7 shows a magnetic field generator 10e as another embodiment of the present invention.

In the magnetic field generator 10e, the ferromagnetic materials 26a and 26b in the magnetic field generator 10 shown in FIG. 1 are replaced by ferromagnetic materials 60a and 60b which have a narrower width than the pole pieces 28a and 28b. This arrangement leaves gaps between the ferromagnetic material 60a and the permanent magnets 18a, 20a, and gaps between the ferromagnetic material 60b and the permanent magnets 18b, 20b. Other arrangements are identical with those in the magnetic field generator 10, and so the description will not be repeated here.

Figure 8:
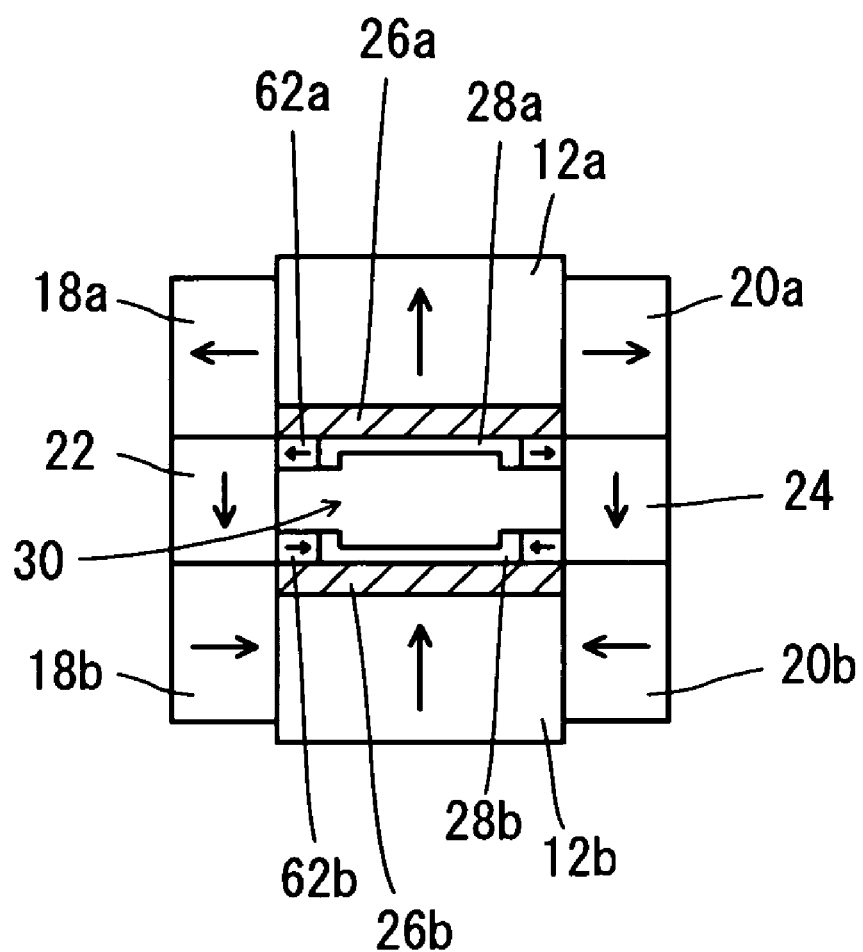
FIG. 8 is a conceptual diagram of still another embodiment of the present invention.

FIG. 8 shows a magnetic field generator 10f as another embodiment of the present invention.

In the magnetic field generator 10f, the pole pieces 28a and 28b of the magnetic field generator 10 shown in FIG. 1 have their outer circumferences provided with annular permanent magnets 62a and 62b respectively. For example, the permanent magnet 62a is magnetized in an outward direction, whereas the permanent magnet 62b is magnetized in an inward direction.

Figure 9:
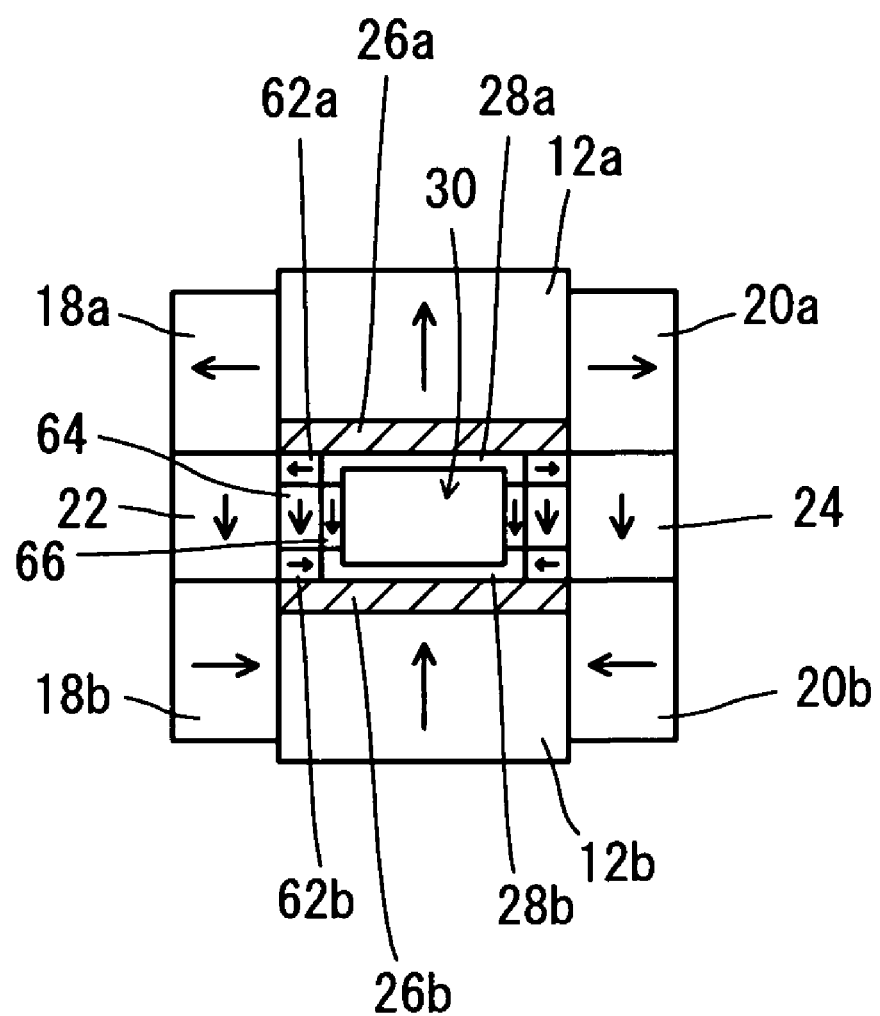
FIG. 9 is a conceptual diagram of another embodiment of the present invention.

FIG. 9 shows a magnetic field generator 10g as another embodiment of the present invention.

The magnetic field generator 10g is a magnetic field generator 10f in FIG. 8, which further includes permanent magnets 64 and 66. The permanent magnet 64 is annular and between the permanent magnets 62a and 62b, whereas the permanent magnet 66 is annular and between the annular projections of the pole pieces 28a and 28b. The permanent magnets 64 and 66 are magnetized in a downward direction for example.

FIG. 10(a) and FIG. 10(b) show a magnetic field generator 10h as another embodiment of the present invention.

The magnetic field generator 10h is a magnetic field generator 10 shown in FIG. 1, which further includes permanent magnets 68a, 70a, 72a, 74a, 68b, 70b, 72b and 74b.

The permanent magnets 68a, 70a, 72a and 74a are added on the permanent magnets 14a, 16a, 18a and 20a respectively in order to bury the protrusion of permanent magnet 12a, i.e. so that upper surfaces of the permanent magnets 68a, 70a, 72a and 74a become flush with the upper surface of the permanent magnet 12a. Likewise, the permanent magnets 68b, 70b, 72b and 74b are placed on lower surfaces of the permanent magnet 14b, 16b, 18b and 20b respectively in order to bury the protrusion of the permanent magnet 12b, i.e. so that lower surfaces of the permanent magnets 68b, 70b, 72b and 74b become flush with the lower surface of the permanent magnet 12b. The permanent magnets 68a, 70a, 72a and 74a are magnetized in an outward direction and the permanent magnets 68b, 70b, 72b and 74b are magnetized in an inward direction preferably, but the directions of magnetization may be slanted. Though not illustrated in FIG. 10, the permanent magnet 70b is provided on a rear side surface of the permanent magnet 12b, to make a pair with the permanent magnet 68b.

FIG. 11(a) and FIG. 11(b) show a magnetic field generator 10i as another embodiment of the present invention.

The magnetic field generator 10i is a magnetic field generator 10 shown in FIG. 1, in which the permanent magnets 12a and 12b are replaced by permanent magnets 76a and 76b. The permanent magnet 76a is thin so that the permanent magnet 76a has its upper surface being flush with upper surfaces of the permanent magnets 14a, 16a, 18a and 20a. Likewise, the permanent magnet 76b is thin so that the permanent magnet 76b has its lower surface being flush with lower surfaces of the permanent magnets 14b, 16b, 18b and 20b. With this arrangement, there is no permanent magnets protruding from the upper surface and the lower surface of the magnetic field generator 10i (there is no protrusions indicated by phantom lines in FIG. 11).

According to the magnetic field generator 10i, the apparatus has a parallelepiped outer shape, which makes easier to handle.

FIG. 12(a) and FIG. 12(b) show a magnetic field generator 10j as another embodiment of the present invention.

The magnetic field generator 10*j* is a magnetic field generator 10 shown in FIG. 1, in which the permanent magnets 22 and 24 are replaced by yokes 78, 80, 82 and 84 each made of iron for example. Specifically, the permanent magnets are connected, not by the permanent magnets 22 and 24, but by the yokes 78, 80, 82 and 84. In other words, the magnetic field generator 10*j* includes a pair of pole piece units 86*a* and 86*b*, and these pole piece units 86*a* and 86*b* are magnetically connected by the yokes 78, 80, 82. Note that FIG. 12(*a*) does not show the yokes 78, 82 nor 84.

According to the magnetic field generator 10*j*, the ferromagnetic materials 26*a* and 26*b* which have a large saturation flux density are provided near the magnetic field generation space 30, at places passed by magnetic fluxes. With this arrangement, it is possible to introduce magnetic fluxes from the magnets around the ferromagnetic material 26*a*, 26*b* efficiently to the magnetic field generation space 30. Also, the ferromagnetic materials 26*a* and 26*b* serve as powerful pole pieces. Therefore, it is possible to introduce magnetic fluxes sufficiently into the magnetic field generation space 30, to improve efficiency of the magnetic circuit and to increase magnetic field intensity generated in the magnetic field generation space 30.

It should be noted here that the magnetic field generator 10*j* may be converted to an open type generator by removing either one of the yokes 78 and 80.

Figure 13:
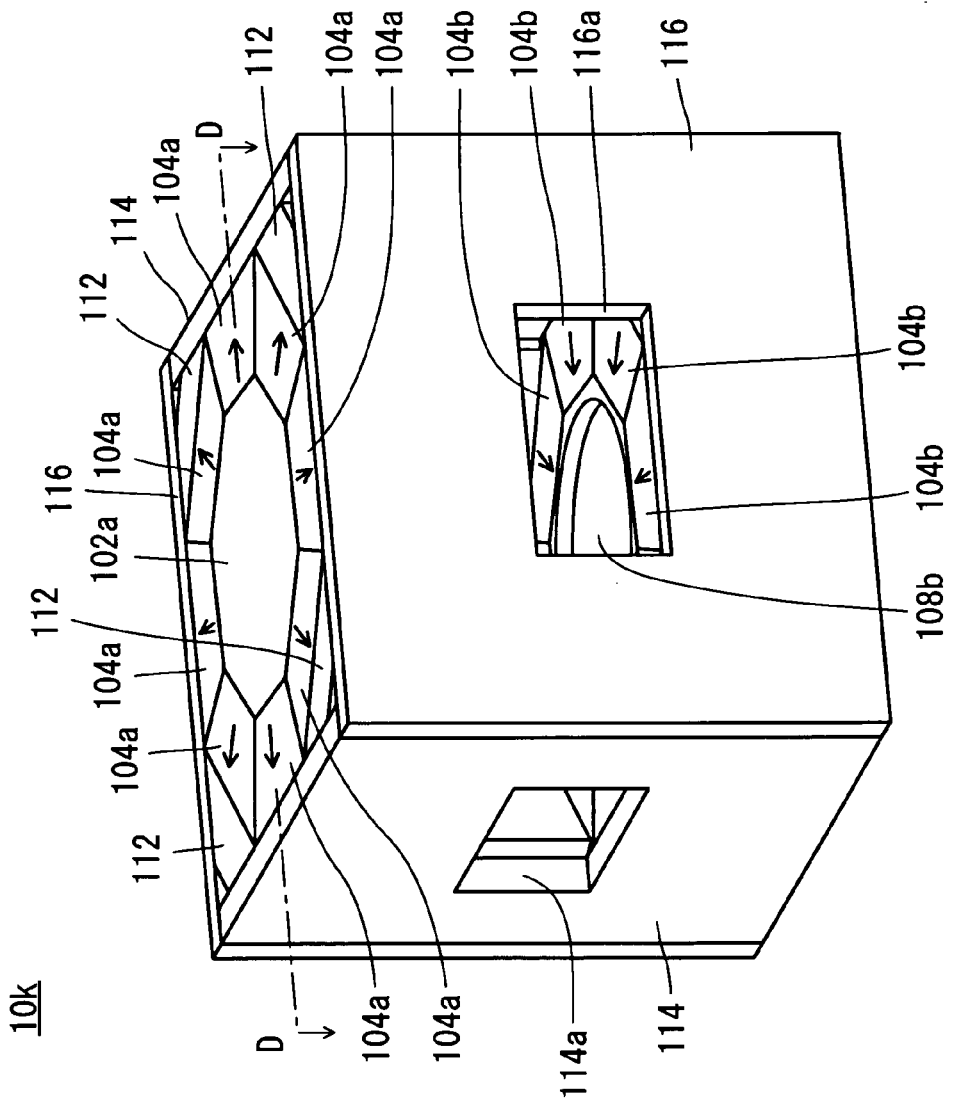
FIG. 13 is a perspective view of another embodiment of the present invention.
Figure 14:
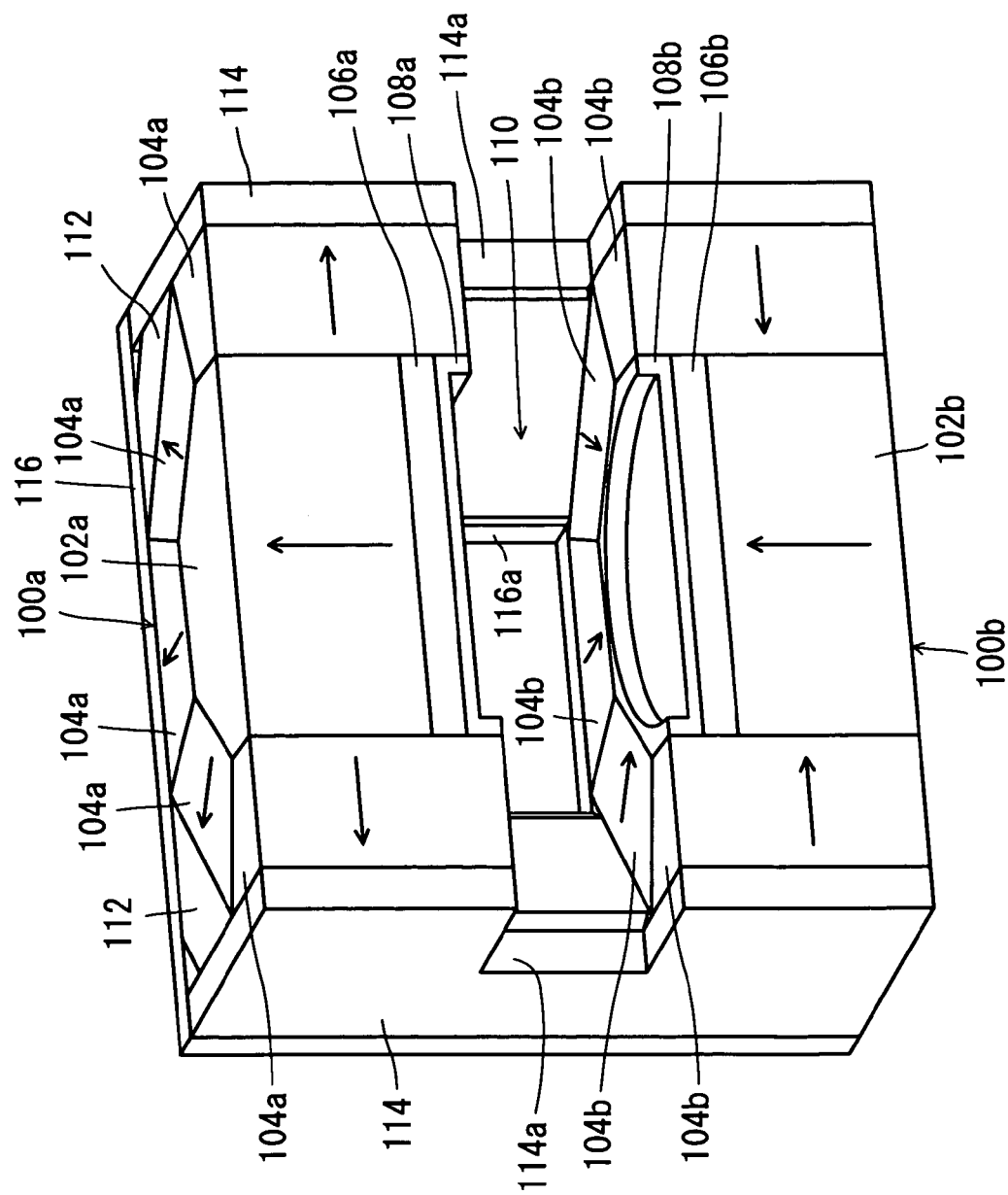
FIG. 14 is a conceptual diagram of the embodiment shown in FIG. 13.

FIG. 13 and FIG. 14 show a magnetic field generator 10*k* as another embodiment of the present invention.

The magnetic field generator 10*k* is a parallelepiped and has outer dimensions of 425 mm×425 mm×372 mm for example. Note that FIG. 14 is a conceptual diagram representing a D—D section (a longitudinal section passing an upper surface of the permanent magnet 102*a*) in FIG. 13.

The magnetic field generator 10*k* includes pole piece units 100*a* and 100*b*. The pole piece units 100*a* and 100*b* include octagonal-prism permanent magnets 102*a* and 102*b* respectively, working as a pair.

The permanent magnet 102*a* is (side walls thereof are) surrounded by eight permanent magnets 104*a* each of which is a prism (obelisk) having a trapezoidal section. The permanent magnet 102*a* is contacted by and magnetically connected with the eight permanent magnets 104*a*.

Likewise, the permanent magnet 102*b* is (side walls thereof are) surrounded by eight permanent magnets 104*b* each of which is a prism (obelisk) having a trapezoidal section. The permanent magnet 102*b* is contacted by and magnetically connected with the eight permanent magnets 104*b*.

The permanent magnets 102*a* and 102*b* have the same dimensions, and so do the permanent magnets 104*a* and 104*b*.

Further, the permanent magnet 102*a* has its lower surface provided with a ferromagnetic material 106*a*, and the permanent magnet 102*b* has its upper surface provided with a ferromagnetic material 106*b*. The ferromagnetic materials 106*a* and 106*b* are provided by high permeability iron, JIS: S15C or permendule for example.

The ferromagnetic material 106*a* is disposed near a magnetic field generation space 110 (to be described later), at a place passed by a magnetic flux, as buried in the permanent magnets. Likewise, the ferromagnetic material 106*b* is disposed near the magnetic field generation space 110, at a place passed by a magnetic flux, as buried in the permanent magnets. As a result, the ferromagnetic material 106*a* is magnetically connected (surface contact) with a plurality of permanent magnets 102*a*, 104*a* which have different directions of magnetization from each other. The same applies to the ferromagnetic material 106*b*.

Further, the ferromagnetic material 106*a* has its lower surface provided with a pole piece 108*a*, and the ferromagnetic material 106*b* has its upper surface provided with a pole piece 108*b*. Therefore, the ferromagnetic material 106*a* is sandwiched between the permanent magnet 102*a* and the pole piece 108*a*, whereas the ferromagnetic material 106*b* is sandwiched between the permanent magnet 102*b* and the pole piece 108*b*. The magnetic field generation space 110 is formed between the pole pieces 108*a* and 108*b*.

As shown in FIG. 14, the ferromagnetic material 106*a* is surrounded by the permanent magnets 102*a*, 104*a* which are magnetized in outward directions as viewed from the ferromagnetic material 106*a* (particularly, the permanent magnets 104*a* are magnetized in a radially outward pattern), i.e. so that the side on the ferromagnetic material 106*a* serves as an S pole. Therefore, the ferromagnetic material 106*a* functions as a powerful South-pole pole piece. On the other hand, the ferromagnetic material 106*b* is surrounded by the permanent magnets 102*b*, 104*b* which are magnetized toward the ferromagnetic material 106*b*, i.e. so that the side on the ferromagnetic material 106*b* serves as an N pole. Therefore, the ferromagnetic material 106*b* functions as a powerful North-pole pole piece.

These upper magnet unit 100*a* and lower magnet unit 100*b* are opposed to each other, to form a magnetic field generation space 110, and connected physically and magnetically in the following steps.

Outward facing surfaces of the mutually corresponding permanent magnets 104*a* and 104*b* are connected by a supporting yoke 112 which is a prism (generally obeliskoid) having a generally trapezoidal cross section, thereby providing magnetic connection between the permanent magnets 104*a* and 104*b*. A total of four supporting yokes 112 are used so that every other set of mutually corresponding permanent magnets 104*a* and 104*b* is connected by one of the yokes 112. Further, with the permanent magnets 104*a*, 104*b* and the support yoke 112 as arranged above, their side surfaces are provided with two plate yokes 114 each having an opening 114*a*, and two plate yokes 116 each having an opening 116*a*.

The magnetic field generator 10*k* offers the same advantages as offered by the magnetic field generator 10*j*. Further, since the permanent magnets 104*a* are magnetized in a radially outward pattern, and the permanent magnets 104*b* are magnetized toward the center, it is possible to efficiently return magnetic leakage flux from the magnetic field generator 10*k* into the magnetic field generation space 110.

Figure 15:
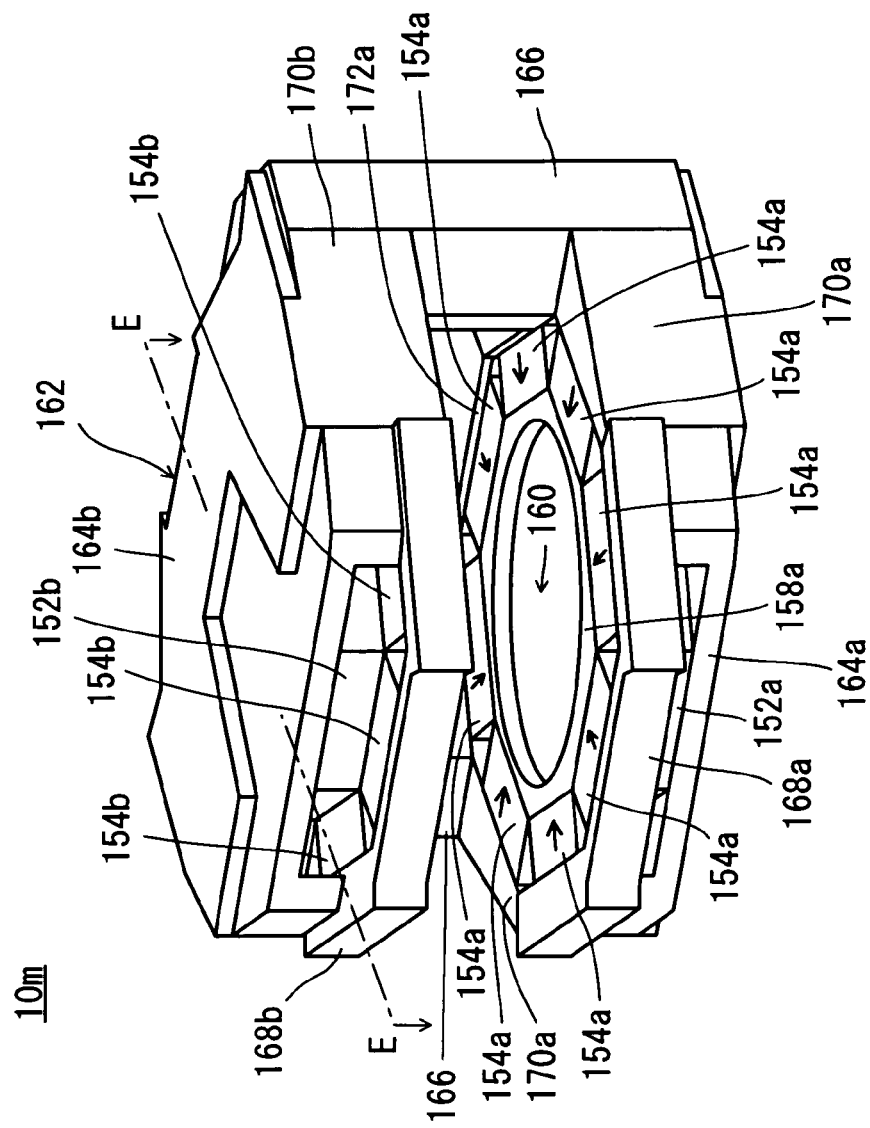
FIG. 15 is a perspective view of another embodiment of the present invention.
Figure 16:
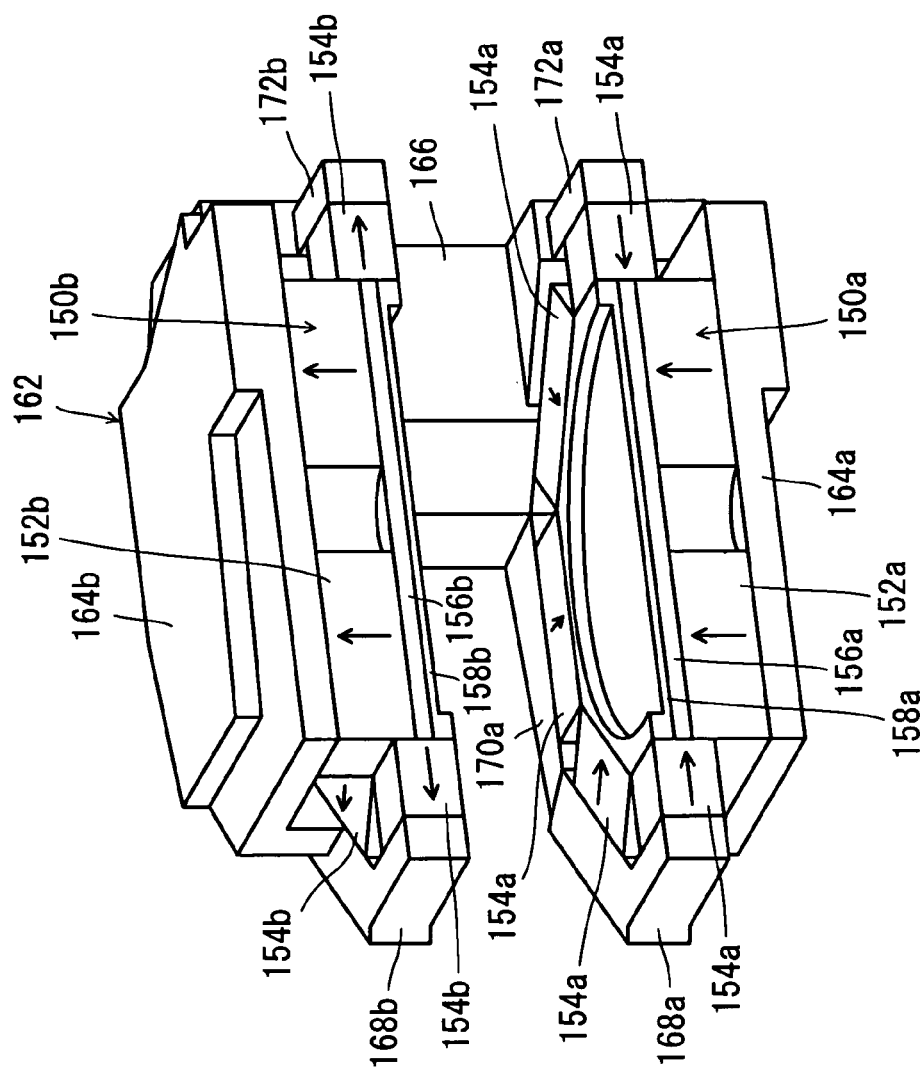
FIG. 16 is a conceptual diagram of the embodiment shown in FIG. 15.

FIG. 15 and FIG. 16 show a magnetic field generator 10*m* as another embodiment of the present invention.

Figure 17:
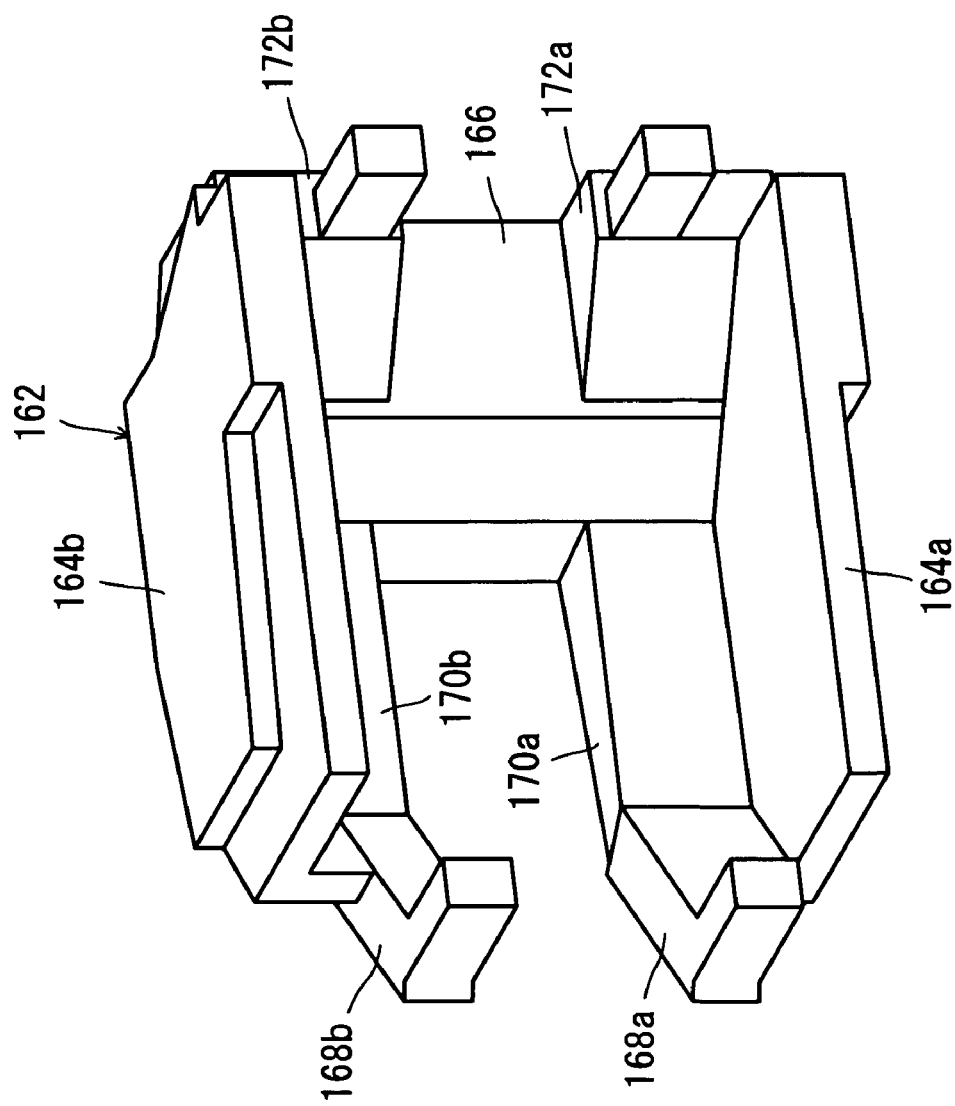
FIG. 17 is a conceptual diagram of a section of a yoke used in the embodiment shown in FIG. 15.

The magnetic field generator 10*m* has dimensions of 2200 mm×1900 mm×1250 mm in its width, depth and height for example, and is big enough to diagnose human bodies. FIG. 16 is a conceptual diagram illustrating an E—E section in FIG. 15 (a longitudinal section passing an upper surface of a permanent magnet 152*b*). FIG. 17 shows a yoke 162 (to be described later) in the conceptual diagram given in FIG. 16.

The magnetic field generator 10*m* includes pole piece units 150*a* and 150*b*. The pole piece units 150*a* and 150*b* include permanent magnets 152*a* and 152*b* respectively, each having a hollow and a regular octagonal cross section.

The permanent magnet 152*a* is (side walls thereof are) surrounded by eight permanent magnets 154*a* each of which is a parallelepiped. The permanent magnet 152*a* is contacted by and magnetically connected with the permanent magnet 154*a*.

Likewise, the permanent magnet 152b is (side walls thereof are) surrounded by eight permanent magnets 154b each of which is a parallelepiped. The permanent magnet 152b is contacted by and magnetically connected with the permanent magnets 154b. The permanent magnets 152a and 152b have the same dimensions, and so do the permanent magnets 154a and 154b.

Further, the permanent magnet 152a has its upper, surface provided with a ferromagnetic material 156a, and the permanent magnet 152b has its lower surface provided with a ferromagnetic material 156b. The ferromagnetic materials 156a and 156b are provided by high permeability iron, JIS:S15C or permendule for example.

The ferromagnetic material 156a is disposed near a magnetic field generation space 160 (to be described later), at a place passed by a magnetic flux, as buried in the permanent magnets. Likewise, the ferromagnetic material 156b is disposed near a magnetic field generation space 160, at a place passed by a magnetic flux, as buried in the permanent magnets. As a result, the ferromagnetic material 156a is magnetically connected (surface contact) with a plurality of permanent magnets 152a, 154a which have different directions of magnetization from each other. The same applies to the ferromagnetic material 156b.

Further, the ferromagnetic material 156a has its upper surface provided with a pole piece 158a, and the ferromagnetic material 156b has its lower surface provided with a pole piece 158b. Therefore, the ferromagnetic material 156a is sandwiched between the permanent magnet 152a and the pole piece 158a, whereas the ferromagnetic material 156b is sandwiched between the permanent magnet 152b and the pole piece 158b. The magnetic field generation space 160 is formed between the pole pieces 158a and 158b.

The pole piece units 150a and 150b as described are opposed to each other to form the magnetic field generation space 160, and connected with the yoke 162 thereby magnetically connected.

Referring to FIG. 17, the yoke 162 has a yoke lower portion 164a, a yoke upper portion 164b, a yoke supporting portion 166, yoke front portions 168a, 168b, yoke side portions 170a, 170b and yoke rear portions 172a, 172b. The permanent magnet 152a is disposed on an upper surface of the yoke lower portion 164a. The permanent magnets 154a have their outer side surfaces covered by the yoke supporting portion 166, the yoke front portion 168a, the yoke side portion 170a and the yoke rear portion 172a. The permanent magnet 152b is disposed on a lower surface of the yoke upper portion 164b. The permanent magnets 154b have their outer side surfaces covered by the yoke supporting portion 166, the yoke front portion 168b, yoke side portion 170b and the yoke rear portion 172b.

The ferromagnetic material 156a is surrounded by the permanent magnets 152a, 154a which are magnetized toward the ferromagnetic material 156a, i.e. so that the side on the ferromagnetic material 156a serves as an N pole. Therefore, the ferromagnetic material 156a functions as a powerful North-pole pole piece. On the other hand, the ferromagnetic material 156b is surrounded by the permanent magnets 152b and 154b which are magnetized in outward directions as viewed from the ferromagnetic material 156b (particularly, the permanent magnets 154b are magnetized in a radially outward pattern), i.e. so that the side on the ferromagnetic material 156b serves as an S pole. Therefore, the ferromagnetic material 156b functions as a powerful south-pole pole piece.

The magnetic field generator 10m offers the same advantages as offered by the magnetic field generator 10k. Further, since the permanent magnets 152a, 152b, 154a and 154b are covered by the yoke 162, the generator is an open type magnetic field generator capable of efficiently returning magnetic leakage flux into the magnetic field generation space 160 through the yoke 162.

Figure 18:
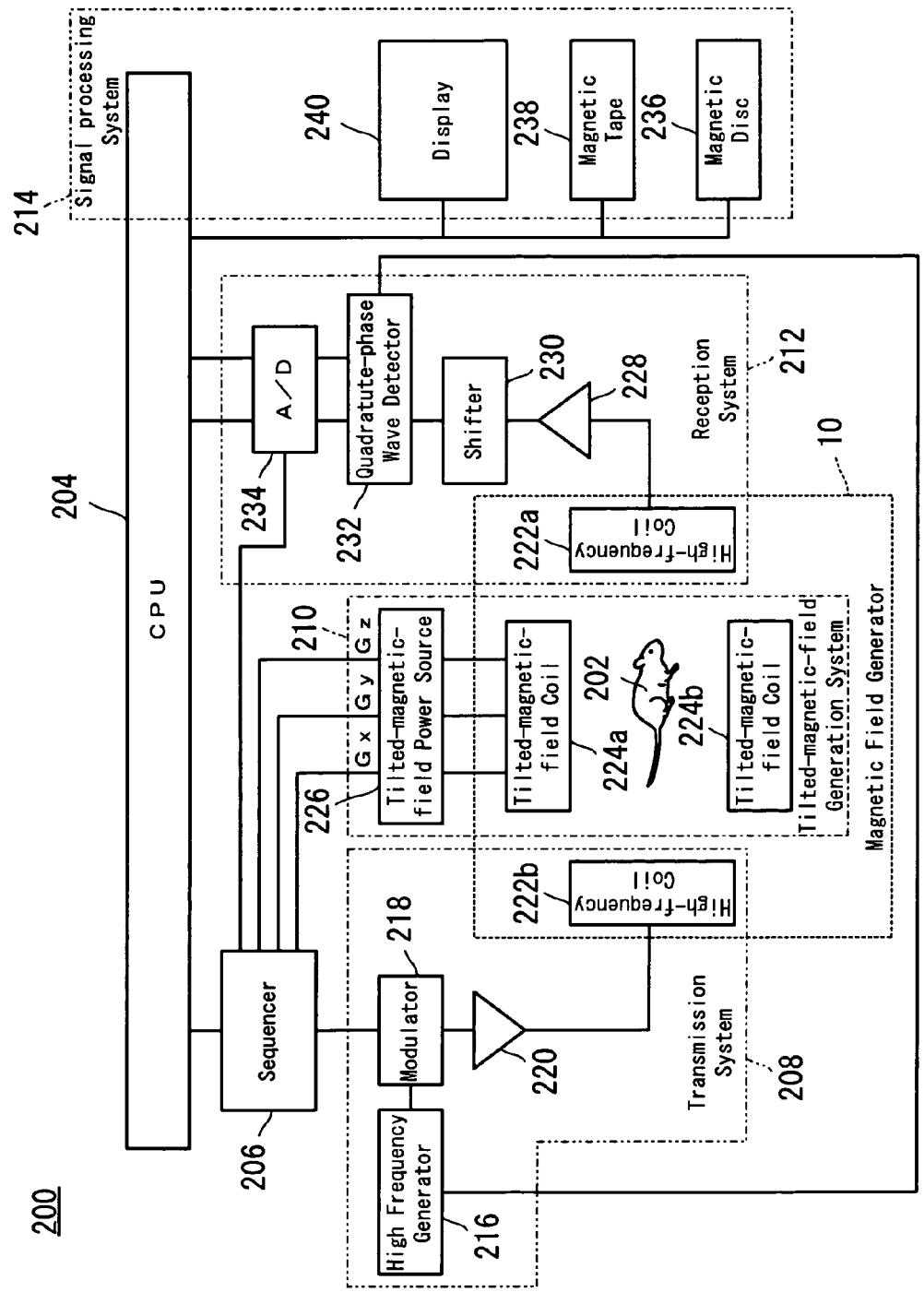
FIG. 18 is a block diagram of an MRI apparatus.

The magnetic field generators so far described, are applicable to an MRI apparatus 200 as shown in FIG. 18. Here, description will be made assuming a case where the magnetic field generator 10 shown in FIG. 1 is used.

Referring to FIG. 18, the MRI apparatus 200 obtains tomographic images of a specimen 202, by using nuclear magnetic resonance (NMR) phenomena, and includes a magnetic field generator 10 which has an opening of a sufficient size, a central processing unit (hereinafter called CPU) 204, a sequencer 206, a transmission system 208, a tilted-magnetic field generation system 210, a reception system 212 and a signal processing system 214. The specimen 202 may be parts of the human body such as a finger, small animals, food and so on, the inside of which is to be checked by the MRI apparatus 200. In the present embodiment, the specimen 202 is provided by a mouse for example.

The magnetic field generator 10 generates a uniform magnetic flux around the specimen 202, longitudinally or across the body.

The sequencer 206 is controlled by the CPU 204, and sends a variety of commands necessary for gathering data of a tomographic image of the specimen 202, to the transmission system 208, the tilted-magnetic-field generation system 210 and the reception system 212.

The transmission system 208 includes a high frequency generator 216, a modulator 218, a high frequency amplifier 220 and a transmitter coil 222b. The high frequency generator 216 outputs high-frequency pulses which undergoes amplitude modulation in the modulator 218 under the commands from the sequencer 206. The high-frequency pulses which have undergone the amplitude modulation are amplified by the high frequency amplifier 220, and then supplied to the high-frequency coil 222b which is placed closely to the specimen 202, to irradiate the specimen 202 with electromagnetic waves.

The tilted-magnetic-field generation system 210 includes tilted-magnetic-field coils 224a, 224b which are wound in three directions of X, Y and Z, and tilted-magnetic-field power source 226 for operating each of the coils. The tilted-magnetic-field power source 226 for each coil is operated in accordance with the commands from the sequencer 206, whereby tilted magnetic fields Gx, Gy and Gz in the three respective directions X, Y and Z are applied to the specimen 202. By varying the application of the tilted magnetic fields Gx, Gy, Gz, different slicing surface of the specimen 202 can be selected.

The high-frequency coil 222b and the tilted-magnetic-field coil 224b are disposed on a main surface of a silicon steel plate which provides the pole piece 28b. Likewise, the high-frequency coil 222a (to be described later) and the tilted-magnetic-field coil 224a are disposed on a main surface of a silicon steel plate which provides the pole piece 28a.

The reception system 212 includes reception high-frequency coil 222a, an amplifier 228, a shifter 230, a quadratute-phase wave detector 232 and an A/D converter 234. When the transmission high-frequency coil 222b gives the electromagnetic wave to the specimen 202, the specimen 202 gives off a responding electromagnetic wave (NMR signal), which is detected by the high-frequency coil 222a disposed near the specimen 202, sent through the amplifier 228, the shifter 230 and the quadratute-phase wave detector 232, and then inputted to the A/D converter 234, where the signal is converted into a digital quantity. In this conversion, the A/D converter 234 samples signals of two series outputted from the quadratute-phase wave detector 232, at a timing specified by the commands from the sequencer 206, and outputs digital signals of two series. These digital signals are sent to the signal processing system 214 for Fourier transformation.

The signal processing system 214 includes a CPU 204, storage devices such as a magnetic disc 236 and a magnetic tape 238, as well as a display 240 provided by e.g. a CRT. The digital signals are utilized to perform Fourier transformation, correction coefficient calculation, re-imaging and other operations, and a signal intensity distribution of a selected cross section, or a distribution obtained through appropriate calculations involving a plurality of signals is converted into an image, which is displayed in the display 240.

Use of the magnetic field generator 10 makes possible to manufacture an MRI apparatus 200 capable of achieving a clearer image.

Alternatively, the other magnetic field generators 10a–10m may be applied to the MRI apparatus 200. In any of these cases, the same advantages are obtained as offered by the case in which the magnetic field generator 10 is used.

The pole pieces 28a, 28b used in the magnetic field generators 10–10j, the pole pieces 108a, 108b used in the magnetic field generator 10k, and the pole pieces 158a, 158b used in the magnetic field generator 10m may each be provided only by an annular projection without a bottom plate (a base plate and a silicon steel plate).

Further, the shape of the annular projection is not limited to circular, but may be oval, quadrangle and so on.

The present invention being thus far described and illustrated in detail, it is obvious that these description and drawings only represent an example of the present invention, and should not be interpreted as limiting the invention. The spirit and scope of the present invention is only limited by words used in the accompanied claims.

The invention claimed is:

1. A magnetic field generator comprising:
   a pair of pole piece units opposed to each other for formation of a magnetic field generation space; and
   a connecting member magnetically connecting the pole piece units,
   wherein each pole piece unit includes:
   a first magnet;
   a ferromagnetic material provided on a first main surface of the first magnet which is a surface on a side of the magnetic field generation space; and
   a plurality of second magnets provided around the first magnet;
   the first magnet has a second main surface facing away from the magnetic field generation space, each of the second magnets has a main surface facing in a same direction as the second main surface,
   the connecting member contacting the second main surface of each first magnet without contacting the main surfaces of the second magnets.

2. The magnetic field generator according to claim 1, wherein a ratio of 1:7.5 through 9:10 is satisfied between a thickness of the ferromagnetic material and a thickness of the first magnet.

3. The magnetic field generator according to claim 2, wherein the ferromagnetic material has a thickness not smaller than 5 mm when a gap formed in the magnetic field generation space is not smaller than 25 mm.

4. The magnetic field generator according to claim 1, wherein the ferromagnetic material is provided with an annular projection on a side of the magnetic field generation space, the annular projection having a side surface spaced from the second magnets by a distance not smaller than 3 mm.

5. The magnetic field generator according to claim 1, wherein the ferromagnetic material is provided with an annular projection on a side of the magnetic field generation space,
   the second magnets provided around the first magnet contacts the ferromagnetic material,
   the first magnet and the second magnets contacting the ferromagnetic material respectively being magnetized in different directions from each other, and the first magnet being magnetized in a direction generally the same as of a magnetic flux in the magnetic field generation space.

6. The magnetic field generator according to claim 1, wherein each of the magnets is parallelepiped.

7. The magnetic field generator according to claim 6, wherein the second magnets disposed at corners on a same plane as on the ferromagnetic material are magnetized in an outward or inward direction as viewed from the ferromagnetic material.

8. The magnetic field generator according to claim 1, wherein a magnetic field not smaller than 1.0 T is generated in the magnetic field generation space.

9. An MRI apparatus including the magnetic field generator according to claim 1.

* * * * *